US012751277B2

(12) United States Patent
Kim et al.

(10) Patent No.: US 12,751,277 B2
(45) Date of Patent: Sep. 29, 2026

(54) SEMICONDUCTOR CHIP WITH STEPPED SIDEWALL, SEMICONDUCTOR PACKAGE INCLUDING THE SAME, AND METHOD OF FABRICATING THE SAME

(71) Applicant: Samsung Electronics Co., Ltd., Suwon-si (KR)

(72) Inventors: Junhyung Kim, Seoul (KR); Jong-Min Lee, Hwaseong-si (KR); Minjung Choi, Suwon-si (KR); Jimin Choi, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1088 days.

(21) Appl. No.: 17/882,748

(22) Filed: Aug. 8, 2022

(65) Prior Publication Data

US 2023/0076238 A1 Mar. 9, 2023

(30) Foreign Application Priority Data

Sep. 9, 2021 (KR) ........................ 10-2021-0120226

(51) Int. Cl.

| | |
|---|---|
| ***H01L 23/528*** | (2006.01) |
| ***H01L 21/822*** | (2006.01) |
| ***H10D 84/03*** | (2025.01) |
| ***H10P 74/00*** | (2026.01) |
| ***H10W 20/41*** | (2026.01) |
| ***H10W 90/00*** | (2026.01) |
| *H10W 90/20* | (2026.01) |

(52) U.S. Cl.

CPC ........ *H10W 20/435* (2026.01); *H10D 84/038* (2025.01); *H10P 74/273* (2026.01); *H10W 90/00* (2026.01); *H10W 90/284* (2026.01); *H10W 90/297* (2026.01); *H10W 90/722* (2026.01)

(58) Field of Classification Search

CPC ....... H01L 21/78; H01L 22/34; H01L 23/562; H01L 22/32

See application file for complete search history.

(56) References Cited

U.S. PATENT DOCUMENTS

| | | | |
|---|---|---|---|
| 6,218,272 | B1 | 4/2001 | Yeom et al. |
| 8,063,496 | B2 | 11/2011 | Cheon et al. |

(Continued)

FOREIGN PATENT DOCUMENTS

| | | | |
|---|---|---|---|
| CN | 108281412 | B | 2/2020 |
| KR | 100289749 | B1 | 5/2001 |

(Continued)

*Primary Examiner* — Nicholas J Tobergte
*Assistant Examiner* — David J Goodwin
(74) *Attorney, Agent, or Firm* — Fish & Richardson P.C.

(57) ABSTRACT

Semiconductor chips, semiconductor packages, and semiconductor chip fabrication methods may be provided. The semiconductor chip includes a substrate including a device region and an edge region, a device layer and a wiring layer sequentially stacked on the substrate, a sub-pad on the device region and a residual test pattern on the edge region wherein a sidewall of the residual test pattern is aligned with a sidewall of the substrate, and an upper dielectric stack covering the sub-pad and the residual test pattern. The upper dielectric stack may expose a portion of a top surface of the residual test pattern. A sidewall of the upper dielectric stack may have a stepped region.

20 Claims, 23 Drawing Sheets

(56) References Cited

U.S. PATENT DOCUMENTS

| | | | | |
|---|---|---|---|---|
| 8,697,455 | B2 | 4/2014 | Lee et al. | |
| 8,934,283 | B2 | 1/2015 | Matsudaira et al. | |
| 10,157,774 | B1 | 12/2018 | Peters et al. | |
| 10,319,908 | B2 | 6/2019 | Narayanan et al. | |
| 11,004,816 | B2 | 5/2021 | Lin et al. | |
| 11,075,181 | B2 | 7/2021 | Han et al. | |
| 11,081,392 | B2 | 8/2021 | Lu et al. | |
| 11,139,199 | B2 | 10/2021 | Han et al. | |
| 11,145,623 | B2 | 10/2021 | Hsu et al. | |
| 2010/0072635 | A1* | 3/2010 | Kuo | H01L 24/13 257/E23.179 |
| 2012/0313094 | A1* | 12/2012 | Kato | H01L 23/585 257/E21.531 |
| 2015/0108641 | A1 | 4/2015 | Chen et al. | |
| 2020/0006315 | A1* | 1/2020 | Tsai | H01L 21/78 |
| 2020/0051932 | A1 | 2/2020 | Han et al. | |
| 2020/0303268 | A1 | 9/2020 | Kim | |
| 2020/0312715 | A1* | 10/2020 | Choi | H01L 21/76838 |
| 2021/0057309 | A1 | 2/2021 | Hu et al. | |
| 2021/0210538 | A1 | 7/2021 | Lai et al. | |

FOREIGN PATENT DOCUMENTS

| | | | |
|---|---|---|---|
| KR | 101341586 | B1 | 12/2013 |
| KR | 20200020500 | A | 2/2020 |
| KR | 20200032299 | A | 3/2020 |
| KR | 20200111369 | A | 9/2020 |
| TW | 202010026 | A | 3/2020 |
| TW | 202022937 | A | 6/2020 |
| TW | 202046464 | A | 12/2020 |
| TW | 202127608 | A | 7/2021 |

* cited by examiner

SEMICONDUCTOR CHIP WITH STEPPED SIDEWALL, SEMICONDUCTOR PACKAGE INCLUDING THE SAME, AND METHOD OF FABRICATING THE SAME

CROSS-REFERENCE TO RELATED APPLICATION

This U.S. nonprovisional application claims priority under 35 U.S.C § 119 to Korean Patent Application No. 10-2021-0120226, filed on Sep. 9, 2021, in the Korean Intellectual Property Office, the disclosure of which is hereby incorporated by reference in its entirety.

BACKGROUND

1. Field

The present inventive concepts relate to semiconductor devices and/or semiconductor packages, and more particularly, to semiconductor chips with a stepped sidewall, semiconductor packages including the semiconductor chip, and/or methods of fabricating the semiconductor chip.

2. Description of the Related Art

In general, a wafer on which semiconductor devices are formed is divided into a chip region on which a plurality of cells are formed and a scribe lane which distinguishes chips from each other. A plurality of semiconductor devices, such as transistors, resistors, and capacitors, are formed on the chip regions and are not formed on the scribe lane. The wafer is sawed along the scribe lane to complete or separate each of the semiconductor devices (or semiconductor chips). The scribe lane may be provided thereon with an alignment key for an exposure process and/or with a test pattern for monitoring electrical properties and defective patterns of the semiconductor devices formed on the chip regions to inspect whether a process is normally performed.

SUMMARY

Some example embodiments of the present inventive concepts provide semiconductor chips with increased reliability.

Some example embodiments of the present inventive concepts provide semiconductor packages with increased reliability.

Some example embodiments of the present inventive concepts provide semiconductor chips fabrication method capable of increasing a yield.

According to some example embodiments of the present inventive concepts, a semiconductor chip may include a substrate including a device region and an edge region, a device layer and a wiring layer sequentially stacked on the substrate, a residual test pattern and a sub-pad on the wiring layer, the sub-pad being on the device region, the residual test pattern being on the edge region, and a sidewall of the residual test pattern being aligned with a sidewall of the substrate, and an upper dielectric stack covering the sub-pad and the residual test pattern. The upper dielectric stack may expose a portion of a top surface of the residual test pattern. A sidewall of the upper dielectric stack may have a stepped region.

According to some example embodiments of the present inventive concepts, a semiconductor chip may include a substrate including a device region and an edge region, a device layer and a wiring layer sequentially stacked on the substrate, a residual test pattern and a sub-pad on the wiring layer, the sub-pad being on the device region, the residual test pattern being on the edge region, and a sidewall of the residual test pattern being aligned with a sidewall of the substrate, an upper dielectric stack covering the sub-pad and the residual test pattern, a passivation layer on the upper dielectric stack, a separation dielectric pattern penetrating the wiring layer on the edge region, a bonding pad in the upper dielectric stack and connected to the sub-pad, a conductive bump penetrating the passivation layer and coupled to the bonding pad, and a solder layer coupled to the conductive bump. The upper dielectric stack may expose a portion of a top surface of the residual test pattern. A sidewall of the upper dielectric stack may have a stepped region. A top surface of the bonding pad may be at a first depth from a top surface of the passivation layer. A bottom surface of the stepped region may be at a second depth from the top surface of the passivation layer. The second depth may be about 0.9 times to about 2.0 times the first depth.

According to some example embodiments of the present inventive concepts, a semiconductor chip may include a substrate including a device region and an edge region, a device layer and a wiring layer sequentially stacked on the substrate, a residual test pattern and a sub-pad on the wiring layer, the sub-pad being on the device region, the residual test pattern being on the edge region, and a sidewall of the residual test pattern being aligned with a sidewall of the substrate, and an upper dielectric stack that covers the sub-pad and the residual test pattern. The upper dielectric stack may expose a portion of a top surface of the residual test pattern. The device layer may include a device interlayer dielectric layer. The upper dielectric stack may include a plurality of upper dielectric layers that are sequentially stacked. A surface roughness at a sidewall of an uppermost one of the upper dielectric layers may be less than a surface roughness at a sidewall of the device interlayer dielectric layer.

According to some example embodiments of the present inventive concepts, a semiconductor package may include a first semiconductor chip, a plurality of second semiconductor chips stacked on the first semiconductor chip, and a mold layer covering lateral surfaces of the second semiconductor chips and a top surface of the first semiconductor chip. Each of the second semiconductor chips may include a second substrate and a circuit structure below the second substrate. The second substrate may include a device region and an edge region that surrounds the device region. The circuit structure may include a device layer and a wiring layer sequentially stacked below the second substrate, a sub-pad and a residual test pattern below the wiring layer, and a dielectric stack covering a bottom surface of the sub-pad and a bottom surface of the residual test pattern. A sidewall of the dielectric stack may have a stepped region. The mold layer may cover the stepped region.

According to some example embodiments of the present inventive concepts, a method of fabricating a semiconductor chip may include forming a wiring layer on a substrate that includes a plurality of device regions and a scribe lane region between the device regions, forming a sub-pad and a test pattern on the wiring layer, the sub-pad being on a corresponding one of the device regions, and the test pattern being on the scribe lane region, forming a first upper dielectric layer that covers the sub-pad and the test pattern, forming on the first upper dielectric layer a bonding pad connected to the sub-pad, forming a second upper dielectric layer that covers the bonding pad and the first upper dielectric layer, etching the second upper dielectric layer on the test pattern to form a preliminary hole that exposes the first upper dielectric layer, and etching the first upper dielectric layer below the preliminary hole to form a first hole that exposes the test pattern and simultaneously etching the second upper dielectric layer on the bonding pad to form a second hole that exposes the bonding pad.

DETAILED DESCRIPTION

Some example embodiments of the present inventive concepts will now be described in detail with reference to the accompanying drawings to aid in clearly explaining the present inventive concepts.

While the term "same," "equal" or "identical" is used in description of example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Figure 1:
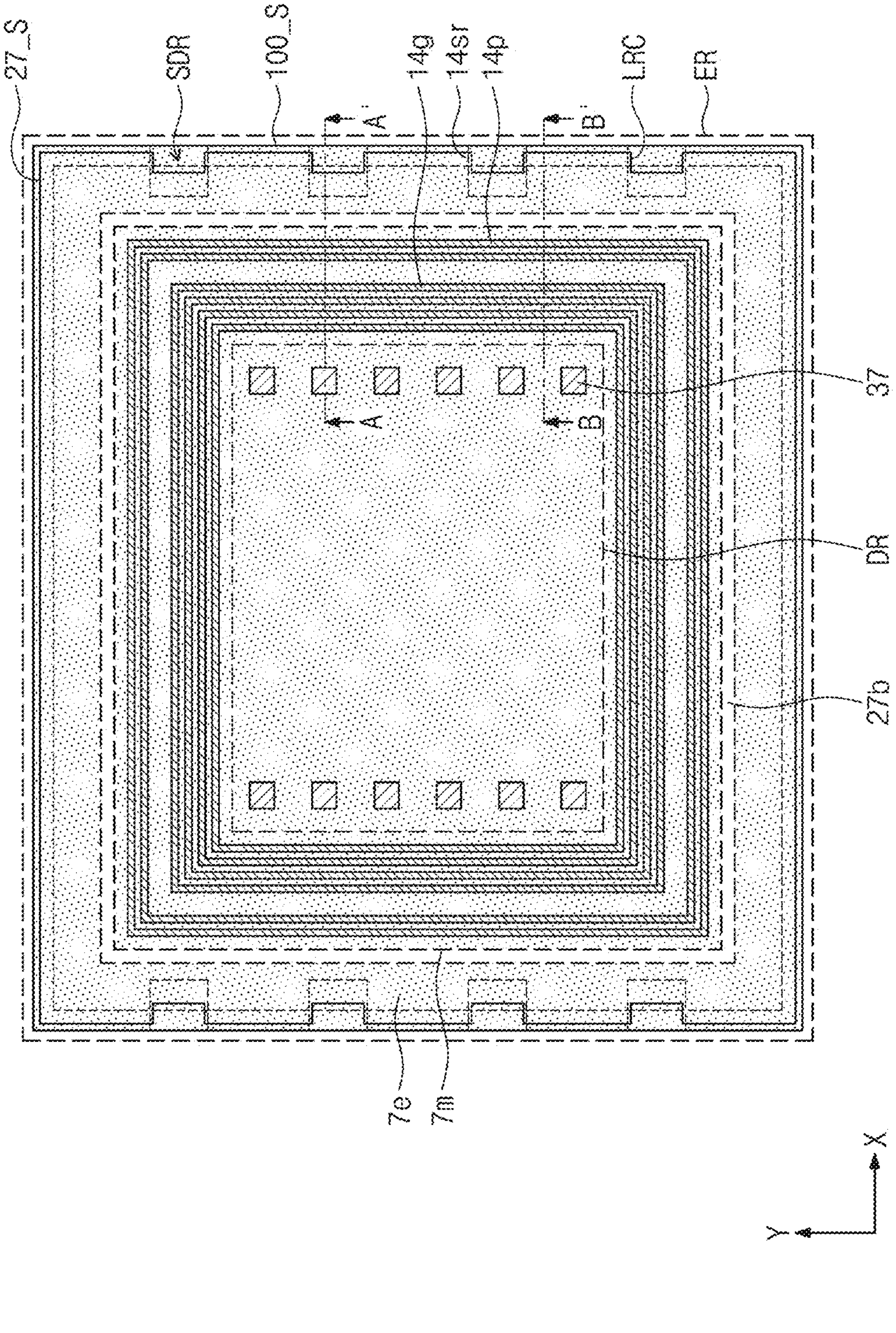
FIG. 1 is a plan view illustrating semiconductor devices according to some example embodiments of the present inventive concepts.
Figure 2A:
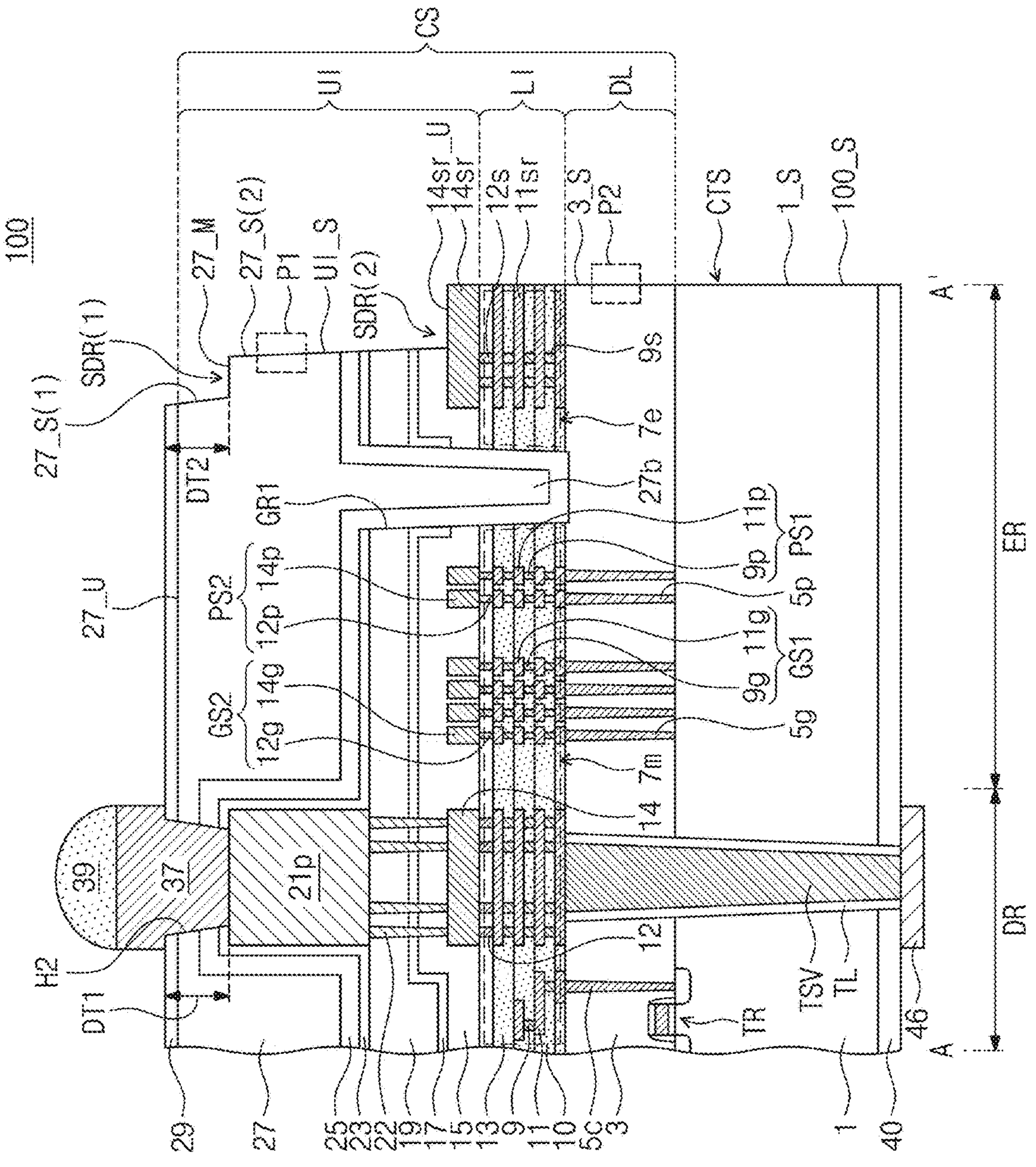
FIG. 2A is a cross-sectional view taken along line A-A' of FIG. 1.
Figure 2B:
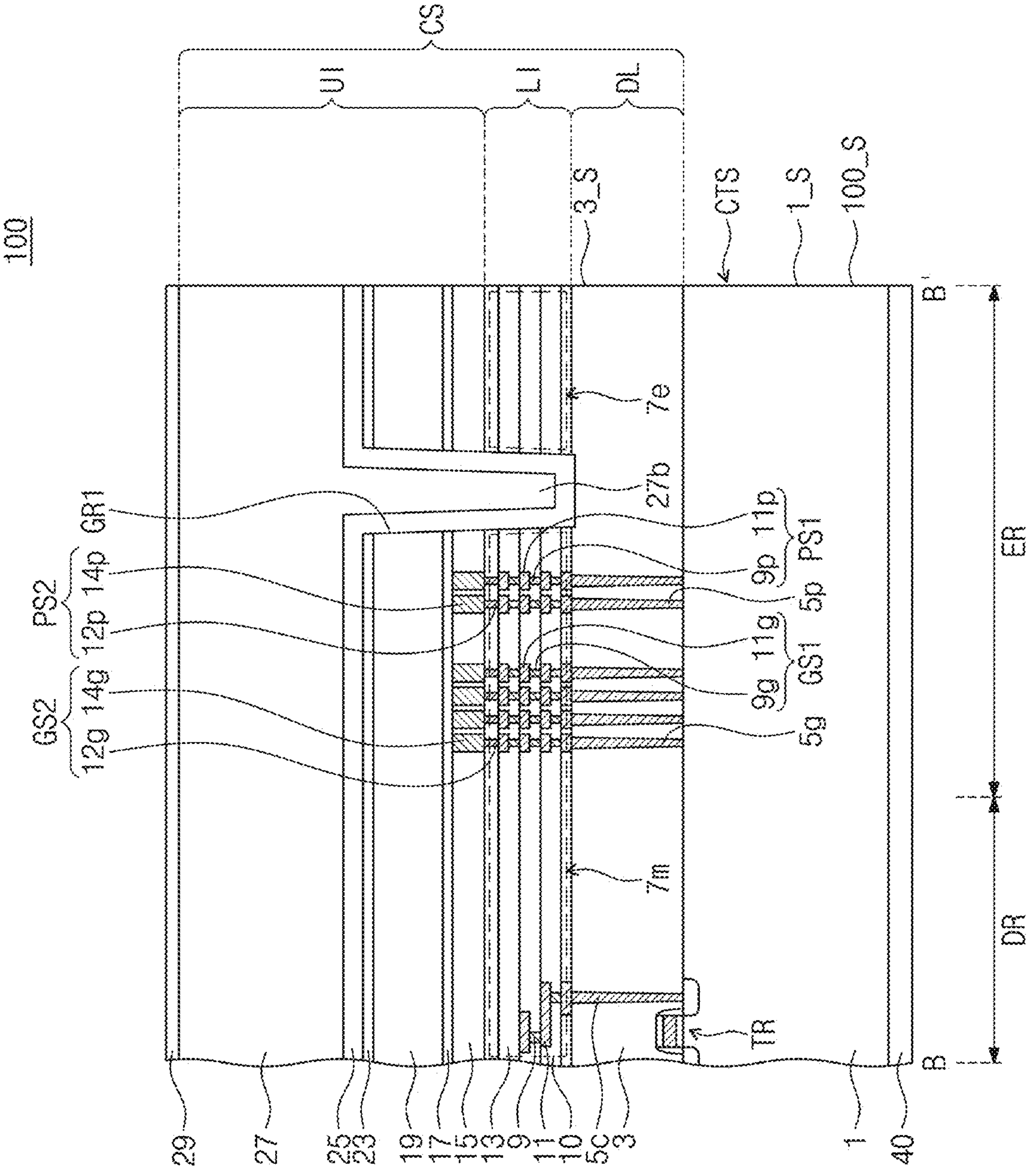
FIG. 2B is a cross-sectional view taken along line B-B' of FIG. 1.

FIG. 1 is a plan view illustrating semiconductor devices according to some example embodiments of the present inventive concepts. FIG. 2A is a cross-sectional view taken along line A-A' of FIG. 1. FIG. 2B is a cross-sectional view taken along line B-B' of FIG. 1.

Referring to FIGS. 1, 2A, and 2B, a semiconductor chip 100 according to the present example embodiment may include a substrate 1 and a circuit structure CS. The substrate 1 may include, for example, a semiconductor material. The substrate 1 may be a monocrystalline silicon substrate. The substrate 1 may include a device region DR and an edge region ER that surrounds the device region DR. The substrate 1 may have a first surface 1*a* and a second surface 1*b* that are opposite to each other. The circuit structure CS may be disposed on the first surface 1*a* of the substrate 1. The circuit structure CS may include a device layer DL, a wiring layer LI, and an upper dielectric stack UI that are sequentially stacked.

On the device region, transistors TR may be disposed on the first surface 1*a* of the substrate 1. Although not shown, on the device region DR, the first surface 1*a* may be provided thereon with a shallow isolation pattern, memory cells, capacitors, and the like. The first surface 1*a* of the substrate 1 may be covered with a device interlayer dielectric layer 3. The device interlayer dielectric layer 3 may have a single-layered or multi-layered structure including, for example, at least one selected from silicon oxide, silicon nitride, and silicon oxynitride.

A chip sidewall 100_S of the semiconductor chip 100 may include a sidewall of a lower passivation layer 40, a sidewall 1_S of the substrate 1, a sidewall 3_S of the device interlayer dielectric layer 3, a sidewall of an edge lower dielectric stack 7*e*, a sidewall of a second residual test pattern 14*sr*, a sidewall UI_S of the upper dielectric stack UI, and a sidewall of an upper passivation layer 29.

On the device region DR, the device interlayer dielectric layer 3 may be provided therein with contact plugs 5*c* connected to the transistors TR. On the edge region ER, the device interlayer dielectric layer 3 may be provided therein with first guard ring patterns 5*g* and first chipping dams 5*p*.

The contact plugs 5*c*, the first guard ring patterns 5*g*, and the first chipping dams 5*p* may include the same material, such as tungsten. Although not shown, the contact plugs 5*c*, the first guard ring patterns 5*g*, and the first chipping dams 5*p* may be covered with a barrier metal provided on lateral and bottom surfaces thereof. The barrier metal may include, for example, at least one selected from titanium, titanium nitride, tantalum, tantalum nitride, and tungsten nitride. The contact plugs 5*c*, the first guard ring patterns 5*g*, and the first chipping dams 5*p* may penetrate the device interlayer dielectric layer 3. The device layer DL may be constituted by the transistors TR, the interlayer dielectric layer 3, the contact plugs 5*c*, the first guard ring patterns 5*g*, and the first chipping dams 5*p*.

Likewise fifth guard ring patterns 14*g* which will be discussed below with reference to FIG. 1, when viewed in a plan view, each of the first guard ring patterns 5*g* may have a ring shape that surrounds the device region DR. The first guard ring patterns 5*g* may serve to protect the device layer DL on the device region DR against moisture and/or physical cracks. Likewise fifth chipping dam patterns 14*p* of FIG. 1, when viewed in a plan view, each of the first chipping dams 5*p* may have a ring shape that surrounds the first guard ring patterns 5*g*. The first chipping dams 5*p* may serve to protect the device layer DL on the device region DR against moisture and/or physical cracks.

The wiring layer LI may be disposed on the device interlayer dielectric layer 3. The wiring layer LI may include a primary lower dielectric stack 7*m* and an edge lower dielectric stack 7*e* that are spaced apart from each other. The primary lower dielectric stack 7*m* and the edge lower dielectric stack 7*e* may each include a plurality of lower intermetallic dielectric layers 10. The lower intermetallic dielectric layers 10 may include a low-k dielectric material which has dielectric constant less than that of silicon oxide. For example, the lower intermetallic dielectric layers 10 may be porous dielectric layers. The lower intermetallic dielectric layers 10 may include SiOCH. Each of the lower intermetallic dielectric layers 10 may have a mechanical strength less than that of the device interlayer dielectric layer 3. Although not shown, an etch stop layer may be interposed between the lower intermetallic dielectric layers 10. The etch stop layer may include, for example, one of silicon nitride, silicon oxynitride, and silicon carbonitride.

The primary lower dielectric stack 7*m* may cover the device region DR and its adjacent portion of the edge region ER. When viewed in a plan view as shown in FIG. 1, the edge lower dielectric stack 7*e* may have a ring shape, may be disposed on the edge region ER, and may surround the primary lower dielectric stack 7*m*. The edge lower dielectric stack 7*e* may have an exposed sidewall. The sidewall of the edge lower dielectric stack 7*e* may be aligned with the sidewall 3_S of the device interlayer dielectric layer 3.

The wiring layer LI may include a plurality of lower wiring patterns 11 disposed in the primary lower dielectric stack 7*m* on the device region DR, and may also include lower via patterns 9 that connect the lower wiring patterns 11 to each other. The wiring layer LI may further include a lower guard ring structure GS1 and a lower chipping dam structure PS1 that are disposed in the primary lower dielectric stack 7*m* on the edge region ER.

The lower guard ring structure GS1 may include second guard ring patterns 11*g* and third guard ring patterns 9*g* that connect the second guard ring patterns 11*g* to each other. The second guard ring patterns 11*g* may be located at the same height (level) as that of the lower wiring patterns 11 and may include the same material as that of the lower wiring patterns 11. The third guard ring patterns 9*g* may be located at the same height (level) as that of the lower via patterns 9 and may include the same material as that of the lower via patterns 9. When viewed in a plan view, the second and third guard ring patterns 11*g* and 9*g* may each have an annular shape that surrounds the device region DR. The lower guard ring structure GS1 may serve to block or protect the wiring layer LI on the device region DR against moisture and/or physical cracks.

The lower chipping dam structure PS1 may include second chipping dam patterns 11*p* and third chipping dam patterns 9*p* that connect the second chipping dam patterns 11*p* to each other. The second chipping dam patterns 11*p* may be located at the same height (level) as that of the lower wiring patterns 11 and may include the same material as that of the lower wiring patterns 11. The third chipping dam patterns 9*p* may be located at the same height (level) as that of the lower via patterns 9 and may include the same material as that of the lower via patterns 9. When viewed in a plan view, the second and third chipping dam patterns 11*p* and 9*p* may each have an annular shape that surrounds the lower guard ring structure GS1. The lower guard ring structure GS1 may serve to block or protect the wiring layer LI on the device region DR against moisture and/or physical cracks.

The wiring layer LI may include first residual test patterns 11*sr* disposed in the edge lower dielectric stack 7*e* and first test via patterns 9*s* that connect the first residual test patterns 11*sr* to each other. The first residual test patterns 11*sr* may be located at the same height (level) as that of the lower wiring patterns 11 and may include the same material as that of the lower wiring patterns 11. The first test via patterns 9*s* may be located at the same height (level) as that of the lower via patterns 9 and may include the same material as that of the lower via patterns 9. The first residual test patterns 11*sr* may be, for example, portions of test patterns. The first residual test patterns 11*sr* may have their sidewalls that are aligned with the sidewall 3_S of the device interlayer dielectric layer 3.

The wiring layer LI may be constituted by the primary lower dielectric stack 7*m*, the edge lower dielectric stack 7*e*, the lower wiring patterns 11, the lower via patterns 9, the lower guard ring structure GS1, the first residual test patterns 11*sr*, and the first test via patterns 9*s*.

The upper dielectric stack UI may be disposed on the wiring layer LI. The upper dielectric stack UI may include first, second, third, fourth, fifth, sixth, and seventh upper intermetallic dielectric layers 13, 15, 17, 19, 23, 25, and 27 that are sequentially stacked. The first, second, third, fourth, fifth, sixth, and seventh upper intermetallic dielectric layers 13, 15, 17, 19, 23, 25, and 27 may each include a dielectric material which has dielectric constant greater than that of the lower intermetallic dielectric layers 10. The first, second, third, fourth, fifth, sixth, and seventh upper intermetallic dielectric layers 13, 15, 17, 19, 23, 25, and 27 may each have a mechanical strength greater than that of the lower intermetallic dielectric layers 10.

The first upper intermetallic dielectric layer 13 may be provided thereon with a sub-pad 14, fifth guard ring patterns 14*g*, fifth chipping dam patterns 14*p*, and a second residual test pattern 14*sr*. The second residual test pattern 14*sr* may be provided in plural, and the plurality of second residual test patterns 14*sr* may be arranged in one column along an edge of the semiconductor chip 100.

Although not shown, upper wiring lines may be additionally disposed on the first upper intermetallic dielectric layer 13 on the device region DR.

The device region DR may be provided thereon with the sub-pad 14, and the edge region ER may be provided thereon with the fifth guard ring patterns 14*g*, the fifth chipping dam patterns 14*p*, and the second residual test pattern 14*sr*. The sub-pad 14, the fifth guard ring patterns 14*g*, the fifth chipping dam patterns 14*p*, and the second residual test pattern 14*sr* may be located at the same level and may be identical in terms of material and thickness T1.

A first upper via pattern 12 may penetrate the first upper intermetallic dielectric layer 13, and may connect the sub-pad 14 to one of the lower wiring patterns 11. Fourth guard ring patterns 12*g* may penetrate the first upper intermetallic dielectric layer 13, and may connect the second guard ring patterns 11*g* to the fifth guard ring patterns 14*g*. Fourth chipping dam patterns 12*p* may penetrate the first upper intermetallic dielectric layer 13, and may connect the second chipping dam patterns 11*p* to the fifth chipping dam patterns 14*p*. Second test via patterns 12*s* may penetrate the first upper intermetallic dielectric layer 13, and may connect the first residual test pattern 11*sr* to the second residual test pattern 14*sr*. The first upper via pattern 12, the fourth guard ring patterns 12*g*, the fourth chipping dam patterns 12*p*, and the second test via patterns 12*s* may be located at the same level and may be identical in terms of material and thickness.

The fourth guard ring patterns 12*g* and the fifth guard ring patterns 14*g* may constitute an upper guard ring structure GS2. When viewed in a plan view, the upper guard ring structure GS2 may surround the device region DR. The fourth chipping dam patterns 12*p* and the fifth chipping dam patterns 14*p* may constitute an upper chipping dam structure PS2. When viewed in a plan view, the upper chipping dam structure PS2 may surround the upper guard ring structure GS2. The upper guard ring structure GS2 and the upper chipping dam structure PS2 may serve to block or protect the device region DR against moisture and/or physical cracks.

The second, third, and fourth upper intermetallic dielectric layers 15, 17, and 19 may be sequentially stacked on the first upper intermetallic dielectric layer 13, the sub-pad 14, the fifth guard ring patterns 14*g*, the fifth chipping dam patterns 14*p*, and the second residual test pattern 14*sr*. The first upper intermetallic dielectric layer 13 and the second upper intermetallic dielectric layer 15 may each include, for example, silicon oxide, tetraethylorthosilicate (TEOS), or high-density plasma (HDP) oxide.

The third upper intermetallic dielectric layer 17 may include, for example, silicon nitride. In such case, the second upper intermetallic dielectric layer 15 may serve as an etch stop layer. In some example embodiments, the third upper intermetallic dielectric layer 17 may include a material whose hydrogen permeability is low. In such case, the third upper intermetallic dielectric layer 17 may serve as a hydrogen barrier. For example, the third upper intermetallic dielectric layer 17 may include at least one selected from aluminum oxide (AlOx), tungsten oxide (WOx), and silicon nitride (SiNx).

The fourth, fifth, sixth, and seventh upper intermetallic dielectric layers 19, 23 25, and 27 may include, for example, one of high-density plasma (HDP) oxide, undoped silicate glass (USG), tetraethylorthosilicate (TEOS), SiN, $SiO_2$, SiOC, SiON, and SiCN.

The first upper intermetallic dielectric layer 13 may have a sidewall aligned with that of the edge lower dielectric stack 7*e*. The second, third, and fourth upper intermetallic dielectric layers 15, 17, and 19 may have their sidewalls that are aligned with each other, and may partially expose a top surface 14*sr*_U of the second residual test pattern 14*sr*.

Second upper via patterns 22 may be coupled to the sub-pad 14 while penetrating the second, third, and fourth upper intermetallic dielectric layers 15, 17, and 19. On the device region DR, a bonding pad 21*p* may be disposed on the fourth upper intermetallic dielectric layer 19. The fifth and sixth upper intermetallic dielectric layers 23 and 25 may be sequentially and conformally formed on the fourth upper intermetallic dielectric layer 19. The fifth and sixth upper intermetallic dielectric layers 23 and 25 may sequentially and conformally cover a sidewall and a top surface of the bonding pad 21*p*.

A portion of the sixth upper intermetallic dielectric layer 25 may penetrate the first, second, third, fourth, and fifth upper intermetallic dielectric layers 13, 15, 17, 19, and 23 between the upper chipping dam structure PS2 and the second residual test pattern 14*sr*, and may be interposed between the primary lower dielectric stack 7*m* and the edge lower dielectric stack 7*e*. A groove GR1 may be formed in the first, second, third, fourth, and fifth upper intermetallic dielectric layers 13, 15, 17, 19, and 23 and between the primary lower dielectric stack 7*m* and the edge lower dielectric stack 7*e*, and a portion of the sixth upper intermetallic dielectric layer 25 may be coupled to the device interlayer dielectric layer 3 while covering a sidewall and a bottom surface of the groove GR1. The sixth upper intermetallic dielectric layer 25 may serve as a capping layer.

The seventh upper intermetallic dielectric layer 27 may have a flat top surface. A portion of the seventh upper intermetallic dielectric layer 27 may be inserted into the groove GR1, thereby filling the groove GR1 and constituting a separation dielectric pattern 27*b*.

When viewed in a plan view as shown in FIG. 1, a sidewall 27_S of the seventh upper intermetallic dielectric layer 27 may have a recessed region LRC that is laterally recessed in a first direction X (or toward the device region DR). The laterally recessed region LRC may be provided in plural, and the plurality of recessed regions LRC may correspondingly overlap the second residual test patterns 14*sr*. When viewed in a plan view, the seventh upper intermetallic dielectric layer 27 may have an irregular structure (e.g., a square wave shape) at the sidewall 27_S thereof. The second, third, fourth, fifth, and sixth upper intermetallic dielectric layers 15, 17, 19, 23, and 25 may have their sidewalls having planar shapes like the sidewall 27_S of the seventh upper intermetallic dielectric layer 27.

Referring to FIGS. 1 and 2A, in the laterally recessed region LRC, the semiconductor chip 100 may have a stepped region SDR or a stepped profile at the chip sidewall 100_S thereof. The stepped region SDR may include a first stepped region SDR(1) and a second stepped region SDR(2). The stepped region SDR may be a double-stepped area. For example, the semiconductor chip 100 may have a stepped chip sidewall 100_S. The chip sidewall 100_S of the semiconductor chip 100 may have a stepwise shape.

The sidewall 27_S of the seventh upper intermetallic dielectric layer 27 may have the first stepped region SDR(1) in the recessed region LRC. The upper dielectric stack UI may have the first stepped region SDR(1) at its sidewall UI_S. For example, the seventh upper intermetallic dielectric layer 27 may have an upper sidewall 27_S(1) and a lower sidewall 27_S(2) that are offset from each other. For the seventh upper intermetallic dielectric layer 27, the upper sidewall 27_S(1) may be connected through an intermediate surface 27_M to the lower sidewall 27_S(2). The seventh upper intermetallic dielectric layer 27 may have a top surface 27_U that is stepped relative to the intermediate surface 27_M, which is stepped relative to the top surface 14*sr*_U of the second residual test pattern 14*sr* (or relative to a top surface of the first upper intermetallic dielectric layer 13), and the second stepped region SDR(2) may be formed by the intermediate surface 27_M and the top surface 14*sr*_U that are stepped relative to each other. The intermediate surface 27_M of the seventh upper intermetallic dielectric layer 27 may be positioned at a second depth DT2 from a top surface of the passivation layer 29. The second depth DT2 may be, for example, about 0.9 times to about 2.0 times a first depth DT1 which will be discussed below.

Referring to FIGS. 1 and 2B, when viewed in cross section taken along line B-B' of the semiconductor chip 100, the chip sidewall 100_S may not be stepwise, but may be vertically flat. For example, the first, second, third, fourth, fifth, sixth, and seventh upper intermetallic dielectric layers 13, 15, 17, 19, 23, 25, and 27 may have their sidewalls, all of which are aligned with each other. The upper dielectric stack UI may have a sidewall aligned with that of the device interlayer dielectric layer 3. When viewed in cross section taken along line B-B' of the semiconductor chip 100, the chip sidewall 100_S may coincide with a cutting surface CTS.

Referring to FIGS. 1 and 2A, when viewed in cross section taken along line A-A' of the semiconductor chip 100, the cutting surface CTS may include the sidewall of the lower passivation layer 40, the sidewall 1_S of the substrate 1, the sidewall 3_S of the device interlayer dielectric layer 3, the sidewall of the edge lower dielectric stack 7*e*, and the sidewall of the second residual test pattern 14*sr*.

The seventh upper intermetallic dielectric layer 27 may serve as a buried dielectric layer. When viewed in a plan view, the groove GR1 and the separation dielectric pattern 27*b* may each have an annular shape that surrounds the device region DR.

The separation dielectric pattern 27*b* and the sixth upper intermetallic dielectric layer 25 may each include a dielectric material which has dielectric constant and mechanical strength greater than dielectric constant and mechanical strength of the lower intermetallic dielectric layers 10. The sixth upper intermetallic dielectric layer 25 may have a density greater than that of the separation dielectric pattern 27*b*. For example, the sixth upper intermetallic dielectric layer 25 may include high density plasma (HDP) oxide, and the separation dielectric pattern 27*b* may include tetraethylorthosilicate (TEOS).

As the wiring layer LI includes the lower intermetallic dielectric layers 10 whose mechanical strengths are low, physical cracks may easily propagate along the lower intermetallic dielectric layers 10 toward the device region DR. In contrast, according to some example embodiments of the present inventive concepts, the groove GR1 and the separation dielectric pattern 27*b* and the sixth upper intermetallic dielectric layer 25 that are positioned in the groove GR1 may block or prevent physical cracks from propagating from the edge region ER toward the device region DR.

When lower intermetallic dielectric layers 10 include a porous dielectric material, moisture may be easily introduced into the semiconductor chip 100. In contrast, according to some example embodiments of the present inventive concepts, the groove GR1 and the separation dielectric pattern 27*b* and the sixth upper intermetallic dielectric layer 25 that are positioned in the groove GR1 may block or prevent moisture from being introduced into the device region DR from an outermost side (e.g., the cutting surface CTS) of the semiconductor chip 100. Thus, the semiconductor chip 100 may increase in reliability.

The lower sidewall 27_S(2) of the seventh upper intermetallic dielectric layer 27 may be aligned with the sidewalls of the second, third, fourth, fifth, and sixth upper intermetallic dielectric layers 15, 17, 19, 23, and 25. The upper passivation layer 29 may be disposed on the upper dielectric stack UI. The upper passivation layer 29 may have single-layered or multi-layered structure including at least one selected from silicon oxide, silicon nitride, and SiCN. The upper passivation layer 29 may have a sidewall aligned with the upper sidewall 27_S(1) of the seventh upper intermetallic dielectric layer 27.

A conductive bump 37 may be coupled to the bonding pad 21*p* while penetrating the upper passivation layer 29 and the fifth, sixth, and seventh upper intermetallic dielectric layers 23, 25, and 27. The conductive bump 37 may be disposed in a second hole H2 formed in the fifth, sixth, and seventh upper intermetallic dielectric layers 23, 25, and 27. The second hole H2 may have a first depth DT1. The first depth DT1 may correspond to a distance between a top surface of the upper passivation layer 29 and the top surface of the bonding pad 21*p*.

A portion of the conductive bump 37 may protrude beyond the upper passivation layer 29. A solder layer 39 may be bonded onto the conductive bump 37. The bonding pad 21*p* may include metal, for example, aluminum. The conductive bump 37 may include metal, for example, copper. The solder layer 39 may include, for example, at least one selected from tin, lead, and silver.

The lower passivation layer 40 may cover the second surface 1*b* of the substrate 1. The lower passivation layer 40 may have a single-layered or multi-layered structure including, for example, at least one selected from silicon oxide, silicon nitride, and SiCN.

On the device region DR, a through electrode TSV may penetrate the device interlayer dielectric layer 3, the substrate 1, and the lower passivation layer 40. The through electrode TSV may be coupled to one of the lower wiring patterns 11. A through dielectric layer TL may be interposed between the through electrode TSV and the substrate 1. The through dielectric layer TL may be, for example, a silicon oxide layer. The lower passivation layer 40 may be provided thereunder with a lower bonding pad 46 coupled to the through electrode TSV. The through electrode TSV may include metal, for example, tungsten or copper. The lower bonding pad 46 may include metal, such as copper, gold, nickel, or aluminum.

Figure 3A:
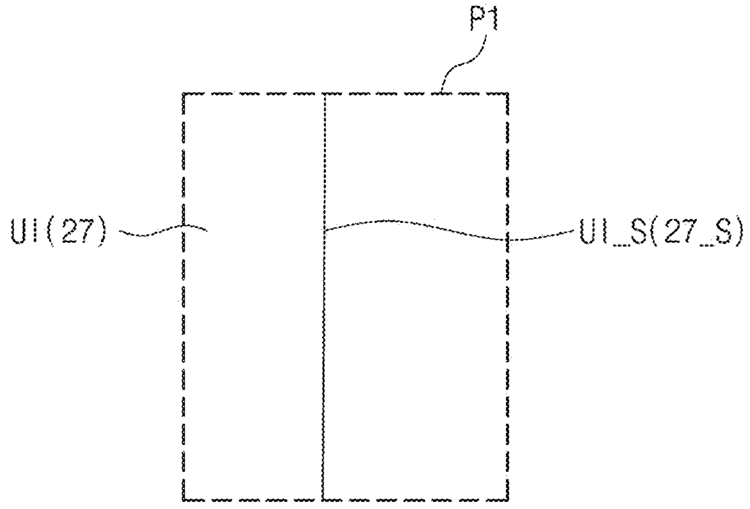
FIG. 3A is an enlarged view showing section P1 of FIG. 2A.
Figure 3B:
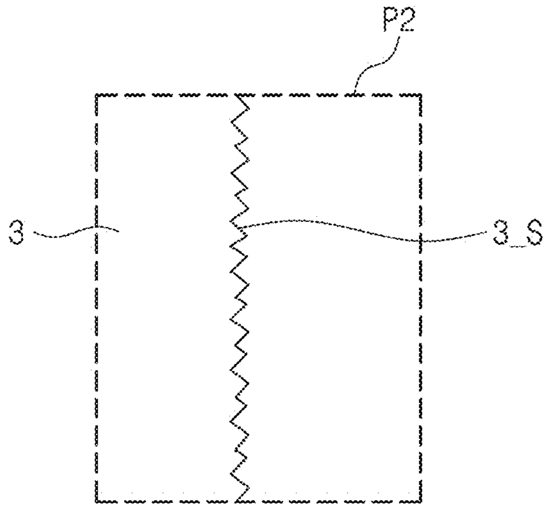
FIG. 3B is an enlarged view showing section P2 of FIG. 2A.

FIG. 3A is an enlarged view showing section P1 of FIG. 2A. FIG. 3B is an enlarged view showing section P2 of FIG. 2A.

Referring to FIGS. 1, 2A, 3A, and 3B, in the laterally recessed region LRC, the sidewall 27_S of the seventh upper intermetallic dielectric layer 27 or the sidewall UI_S of the upper dielectric stack UI may have a relatively smooth surface of a relatively small surface roughness. In contrast, the sidewall 3_S of the device interlayer dielectric layer 3 may have a relatively rough surface or a relatively large surface roughness. The sidewall 27_S of the seventh upper intermetallic dielectric layer 27 or the sidewall UI_S of the upper dielectric stack UI may be formed by an etching process and may thus have a relatively small surface roughness, but the sidewall 3_S of the device interlayer dielectric layer 3 may be cut with a blade and may thus have a relatively large surface roughness.

The seventh upper intermetallic dielectric layer 27 may have a larger surface roughness at the sidewall 27_S in cross section taken along line B-B' shown in FIG. 2B and a smaller surface roughness at the sidewall 27_S in cross section taken along line A-A' shown in FIG. 2A.

For the semiconductor chip 100 according to some example embodiments of the present inventive concepts, a metal pattern, located at the same level as that of the bonding pad 21*p*, may not be exposed on the sidewall UI_S of the upper dielectric stack UI. Therefore, electrical short due to metal burs may not occur when the semiconductor chip 100 is mounted. Accordingly, there may be an increase in reliability of a semiconductor package including the semiconductor chip 100.

Figure 4:
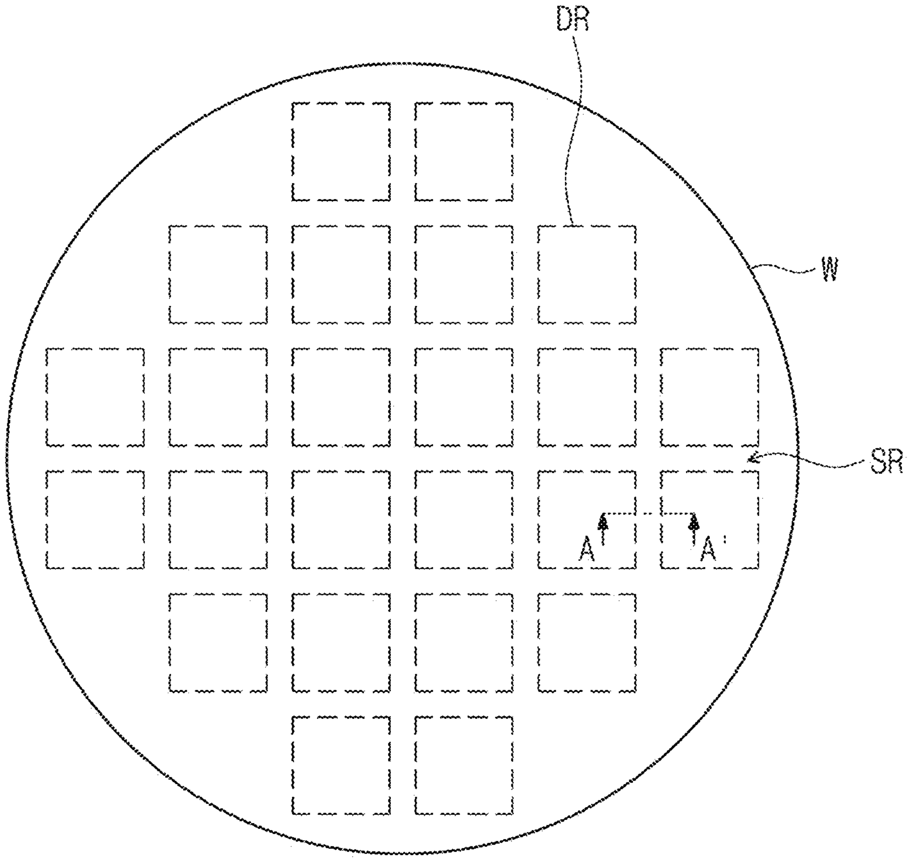
FIG. 4 is a plan view showing a wafer.

FIG. 4 is a plan view showing a wafer. FIGS. 5A to 5K are cross-sectional views illustrating method of fabricating a semiconductor chip having the cross section of FIG. 2A. FIGS. 5A to 5K are cross-sectional views taken along line A-A' of FIG. 4.

Figure 5A:
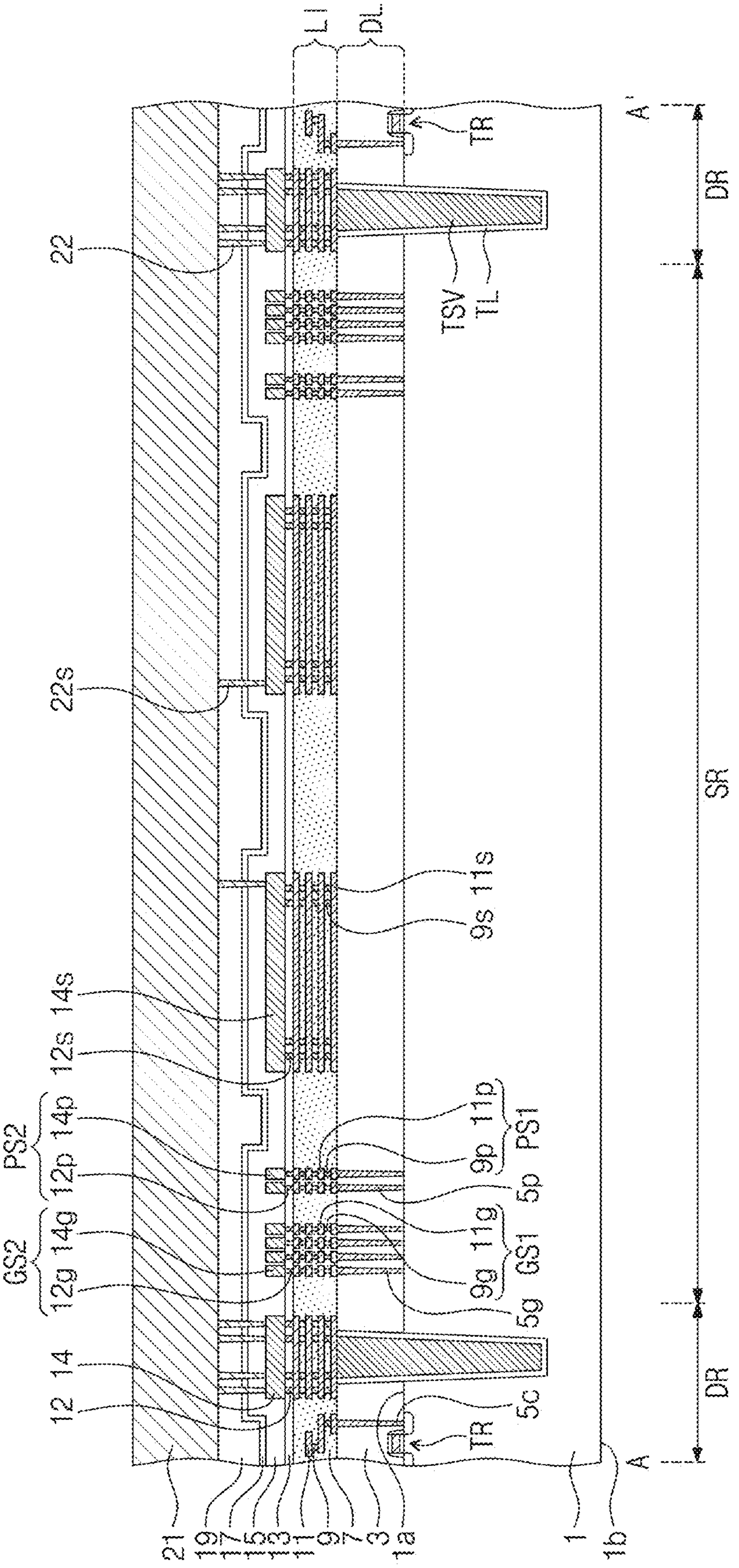
FIGS. 5A to 5K are cross-sectional views illustrating methods of fabricating a semiconductor chip having the cross section of FIG. 2A.

Referring to FIGS. 4 and 5A, a plurality of device regions DR may be arranged on a wafer W. Each of the device regions DR may be called a chip region. A scribe lane region SR may be disposed between the device regions DR. The wafer W may correspond to the substrate 1 of FIG. 5A. An ordinary procedure may be employed to form a device layer DL on a first surface 1*a* of the substrate 1. The device layer DL and the substrate 1 may be etched to form holes for through electrodes, and through electrodes TSV and through dielectric layers TL may be formed in the holes.

Ordinary procedures may be formed to form a wiring layer LI on the device layer DL. The wiring layer LI may include a lower dielectric stack 7 including a plurality of lower intermetallic dielectric layers 10 of FIG. 2A. The lower dielectric stack 7 may be provided therein with lower wiring patterns 11, lower via patterns 9, a lower guard ring structure GS1, a lower chipping dam structure PS1, first test patterns 11*s*, and first test via patterns 9*s*.

A first upper intermetallic dielectric layer 13 may be formed on the wiring layer LI. First upper via patterns 12, fourth guard ring patterns 12*g*, fourth chipping dam patterns 12*p*, and second test via patterns 12*s* may be formed to penetrate the first upper intermetallic dielectric layer 13. A sub-pad 14, fifth guard ring patterns 14*g*, fifth chipping dam patterns 14*p*, and a second residual test pattern 14*sr* may be formed on the first upper intermetallic dielectric layer 13. A plurality of second test patterns 14*s* may be provided, and the plurality of second test patterns 14*s* may be arranged in one or more columns on the scribe lane region SR.

Second, third, and fourth upper intermetallic dielectric layers 15, 17, and 19 may be sequentially stacked on the first upper intermetallic dielectric layer 13 to cover the sub-pad 14, the fifth guard ring patterns 14*g*, the fifth chipping dam patterns 14*p*, and the second test patterns 14*s*. Second upper via patterns 22 may be formed to penetrate the second, third, and fourth upper intermetallic dielectric layers 15, 17, and 19. In this stage, a third test via pattern 22*s* may be formed to penetrate the second, third, and fourth upper intermetallic dielectric layers 15, 17, and 19. The second upper via patterns 22 may be connected to the sub-pad 14. The third test via pattern 22*s* may be connected to the second test pattern 14*s*.

A metal-containing layer 21 may be formed on the fourth upper intermetallic dielectric layer 19. The metal-containing layer 21 may include, for example, aluminum.

Figure 5B:
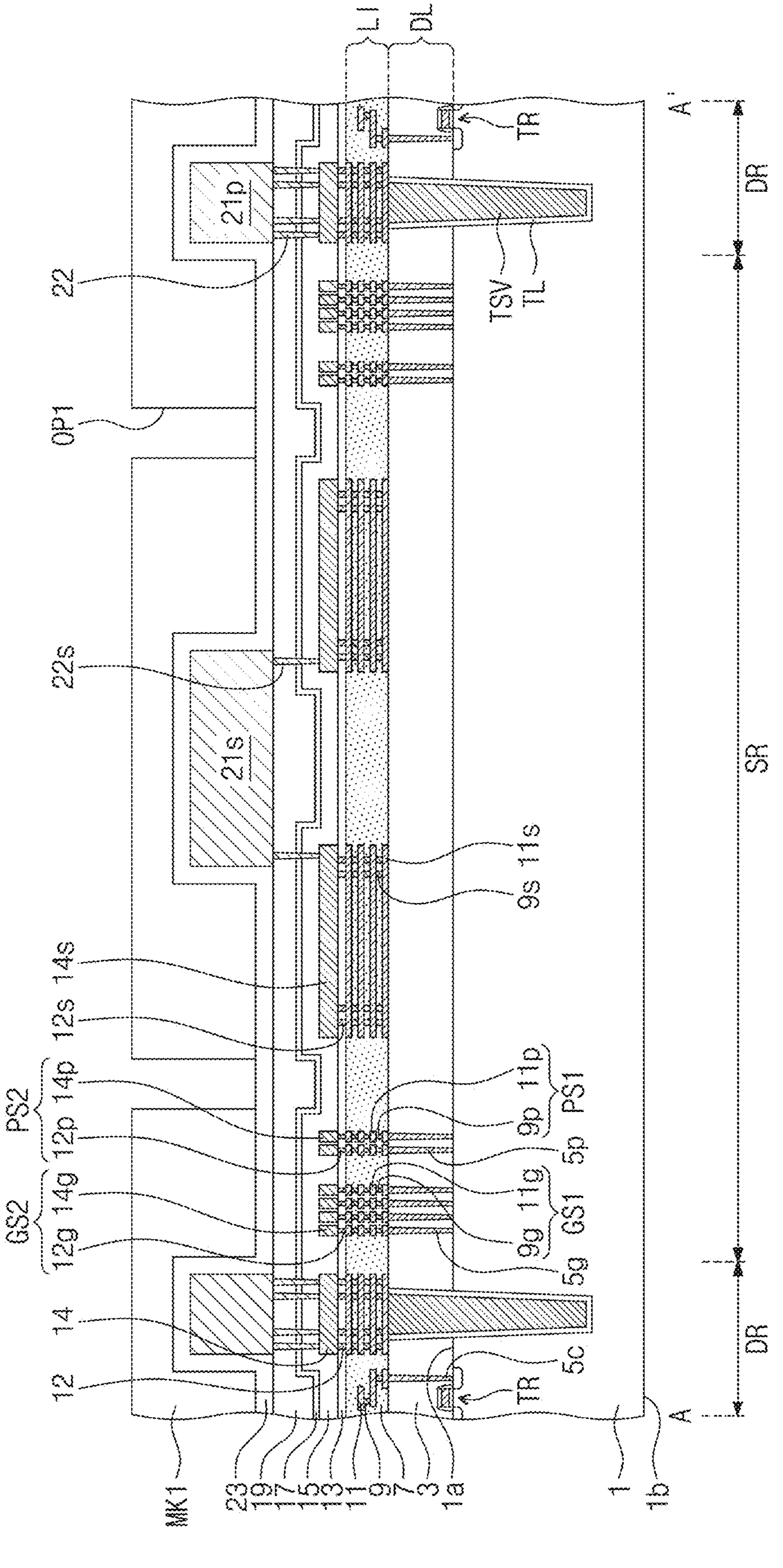

Referring to FIGS. 5A and 5B, the metal-containing layer 21 may be etched to form a bonding pad 21*p* on the device region DR and to form a third test pattern 21*s* on the edge region ER. A fifth upper intermetallic dielectric layer 23 may be conformally stacked on the fourth upper intermetallic dielectric layer 19 to cover the bonding pad 21*p* and the third test pattern 21*s*. A first mask pattern MK1 may be formed on the fifth upper intermetallic dielectric layer 23. The first mask pattern MK1 may be, for example, a photoresist pattern or a spin-on-hardmask (SOH) pattern. The first mask pattern MK1 may have first openings OP1. The first openings OP1 may overlap a region between the second test pattern 14*s* and the upper chipping dam structure PS2. The first openings OP1 may each have a ring shape that surrounds the device region DR.

Figure 5C:
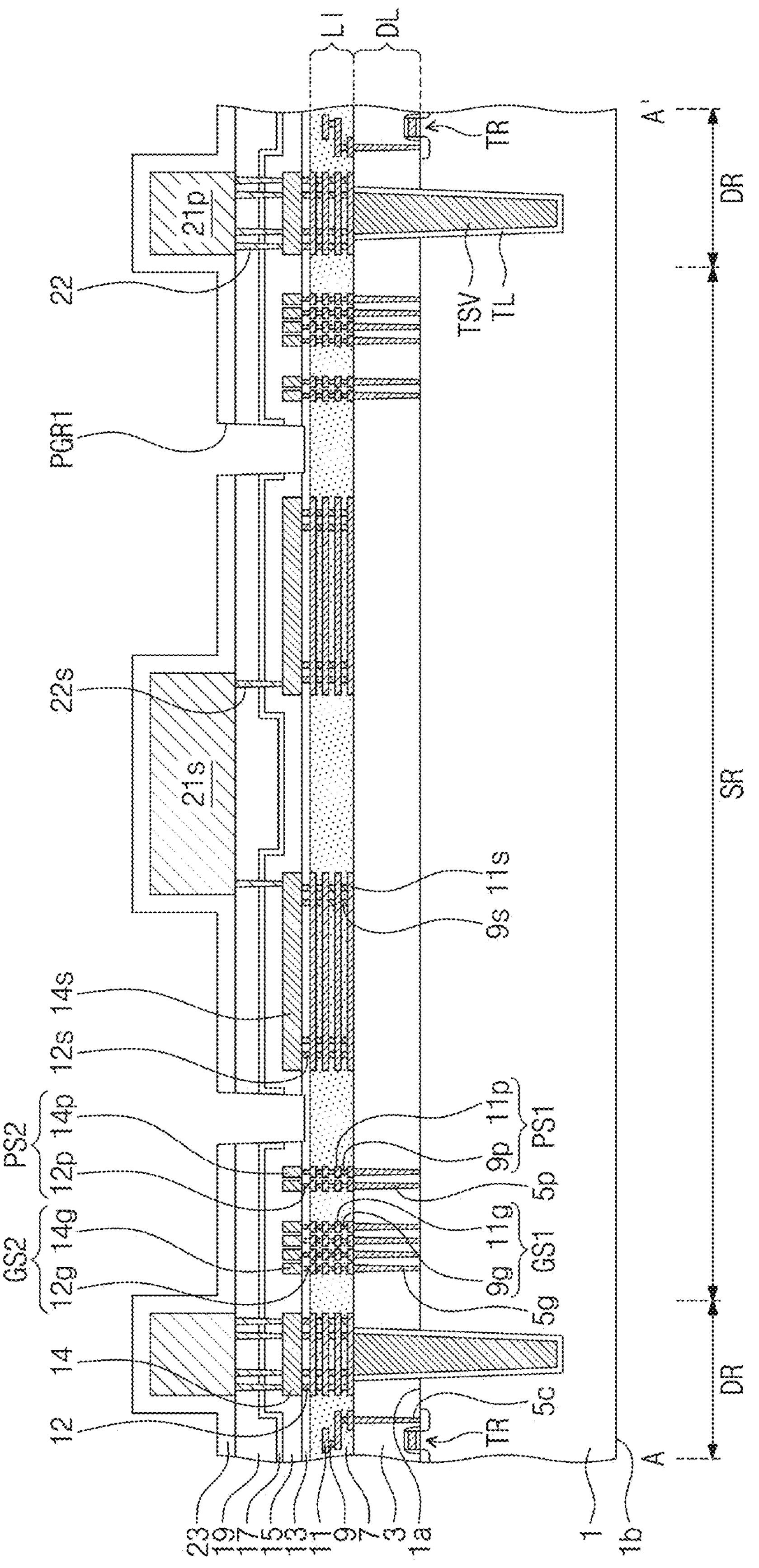

Referring to FIGS. 5B and 5C, the first mask pattern MK1 may be used as an etching mask to etch the second, third, fourth, and fifth upper intermetallic dielectric layers 15, 17, 19, and 23 to form a preliminary groove PGR1 that exposes the first upper intermetallic dielectric layer 13. The first mask pattern MK1 may be removed.

Figure 5D:
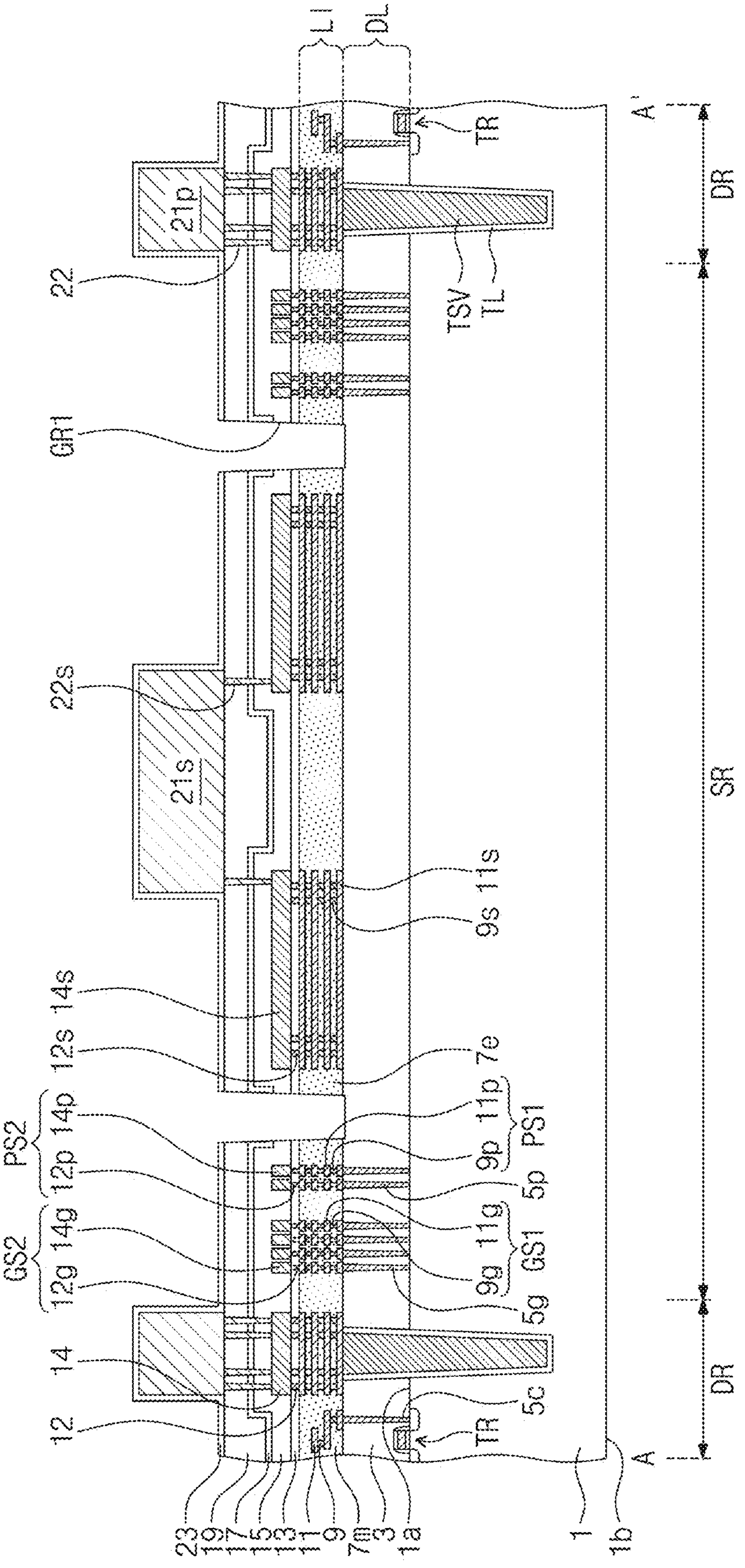

Referring to FIGS. 5C and 5D, the fifth upper intermetallic dielectric layer 23, in which the preliminary groove PGR1 has been formed, may be used as an etching mask to etch the lower dielectric stack 7 into a primary lower dielectric stack 7*m* and an edge lower dielectric stack 7*e*. Therefore, a groove GR1 exposing a top surface of the device interlayer dielectric layer 3 may be formed.

Figure 5E:
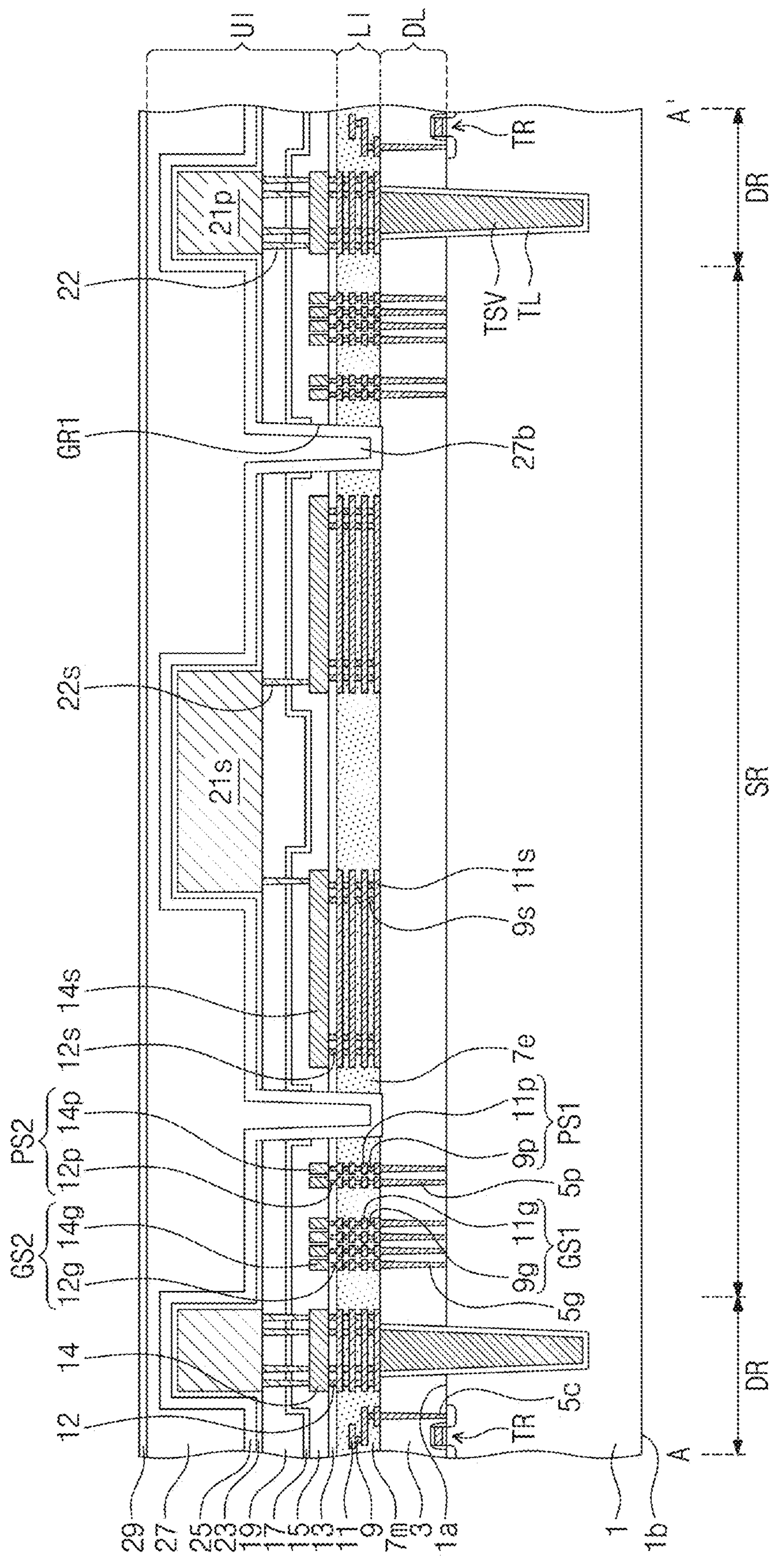

Referring to FIG. 5E, a sixth upper intermetallic dielectric layer 25 may be conformally formed on the fifth upper intermetallic dielectric layer 23 to cover a sidewall and a bottom surface of the groove GR1. A seventh upper intermetallic dielectric layer 27 may be formed on the sixth upper intermetallic dielectric layer 25 to form a separation dielectric pattern 27*b* that fills the groove GR1. A planarization process may be performed to cause the seventh upper intermetallic dielectric layer 27 to have a flat top surface. An upper passivation layer 29 may be formed on the seventh upper intermetallic dielectric layer 27.

Figure 5F:
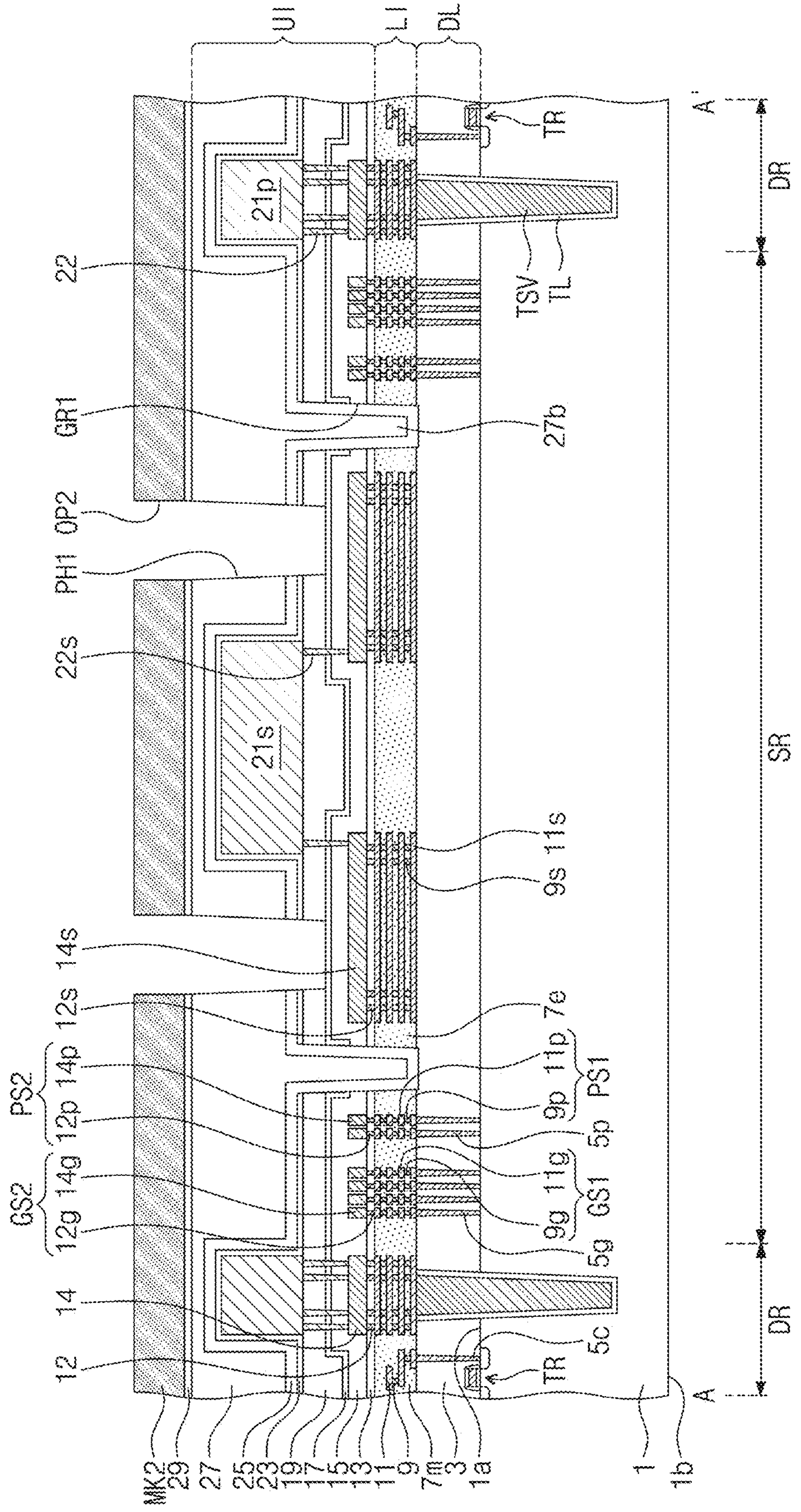

Referring to FIGS. 5E and 5F, a second mask pattern MK2 may be formed on the seventh upper intermetallic dielectric layer 27. The second mask pattern MK2 may include second openings OP2 that are spaced apart from the third test pattern 21*s* and overlap the second test pattern 14*s*. The second mask pattern MK2 may be used as an etching mask to etch the upper passivation layer 29 and its underlying fourth, fifth, sixth, and seventh upper intermetallic dielectric layers 19, 23, 25, and 27 to form one or more preliminary holes PH1 that expose the third upper intermetallic dielectric layer 17. The third upper intermetallic dielectric layer 17 may serve as an etch stop layer.

Figure 5G:
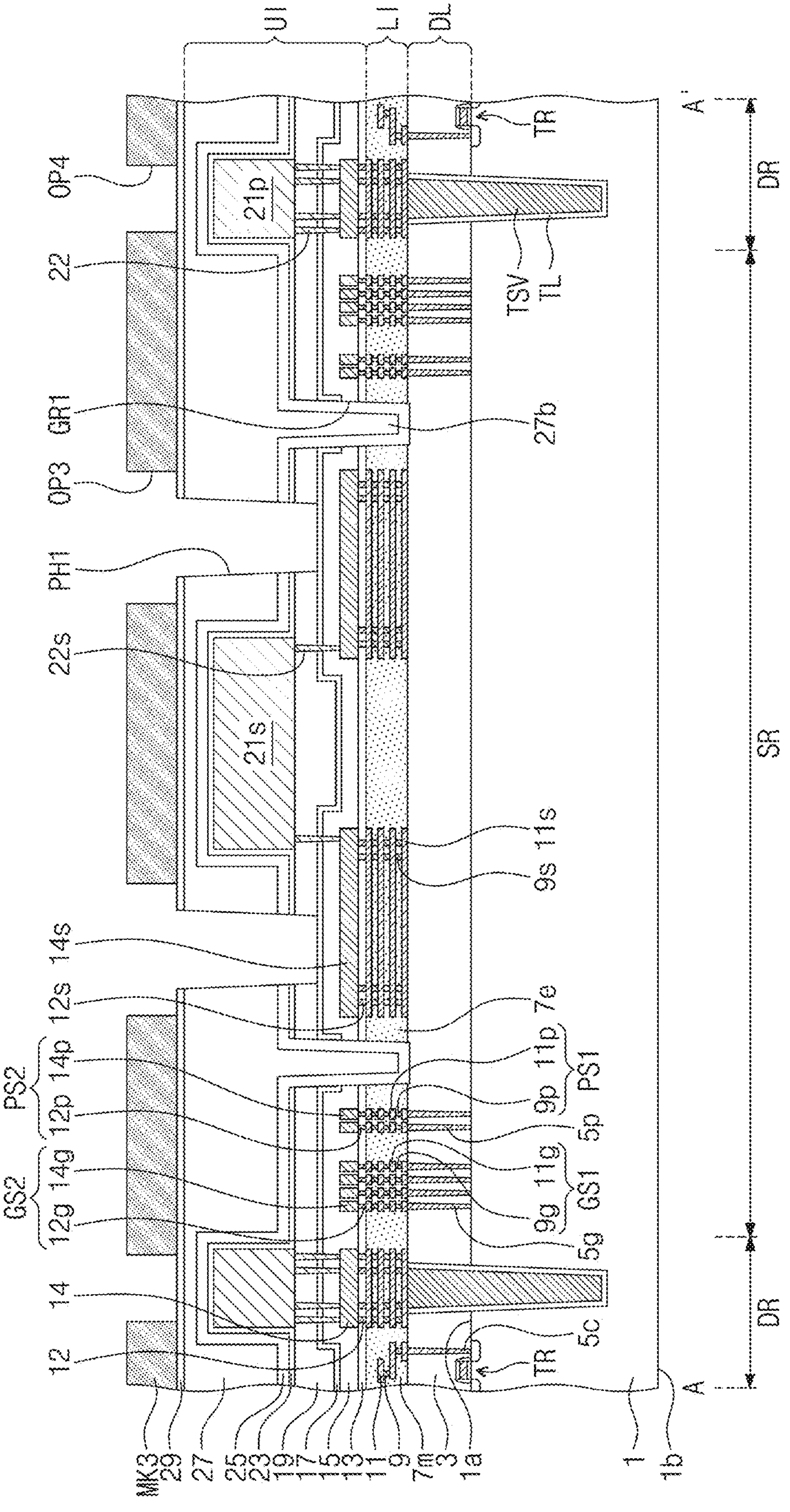

Referring to FIGS. 5F and 5G, after the second mask pattern MK2 is removed, a third mask pattern MK3 may be formed on the upper passivation layer 29. The third mask pattern MK3 may have third openings OP3 and fourth openings OP4. The third openings OP3 may be formed to overlap the preliminary holes PH1 and to each have a width (see W2 of FIG. 5I) greater than a width (see W1 of FIG. 5I) of the preliminary hole PH1. The third openings OP3 may expose a top surface of the upper passivation layer 29 in an upper portion of the preliminary hole PH1. The fourth openings OP4 may overlap the bonding pads 21*p*.

Figure 5H:
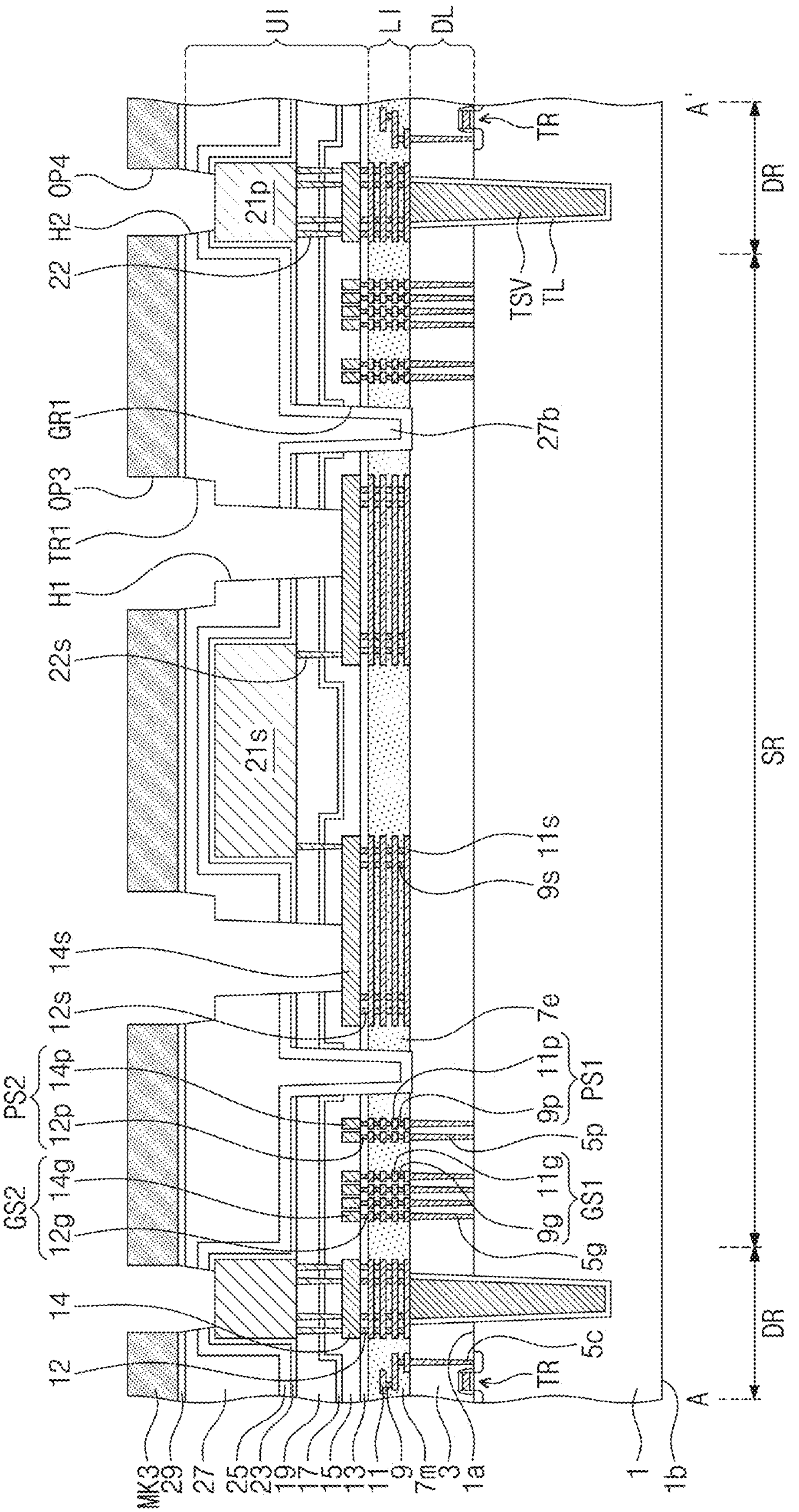

Referring to FIGS. 5G and 5H, the third mask pattern MK3 may be used as an etching mask to perform an etching process on the upper dielectric stack UI. Therefore, the second and third upper intermetallic dielectric layers 15 and 17 below the preliminary hole PH1 may be etched to form a first hole H1 that exposes the second test pattern 14*s*. The upper passivation layer 29 and the seventh upper intermetallic dielectric layer 27 in the upper portion of the preliminary hole PH1 may be etched to form, on the first hole H1, a first trench TR1 that overlaps the preliminary hole PH1. The first trench TR1 may be formed to have a sidewall spaced apart from the third test pattern 21*s*.

Figure 5I:
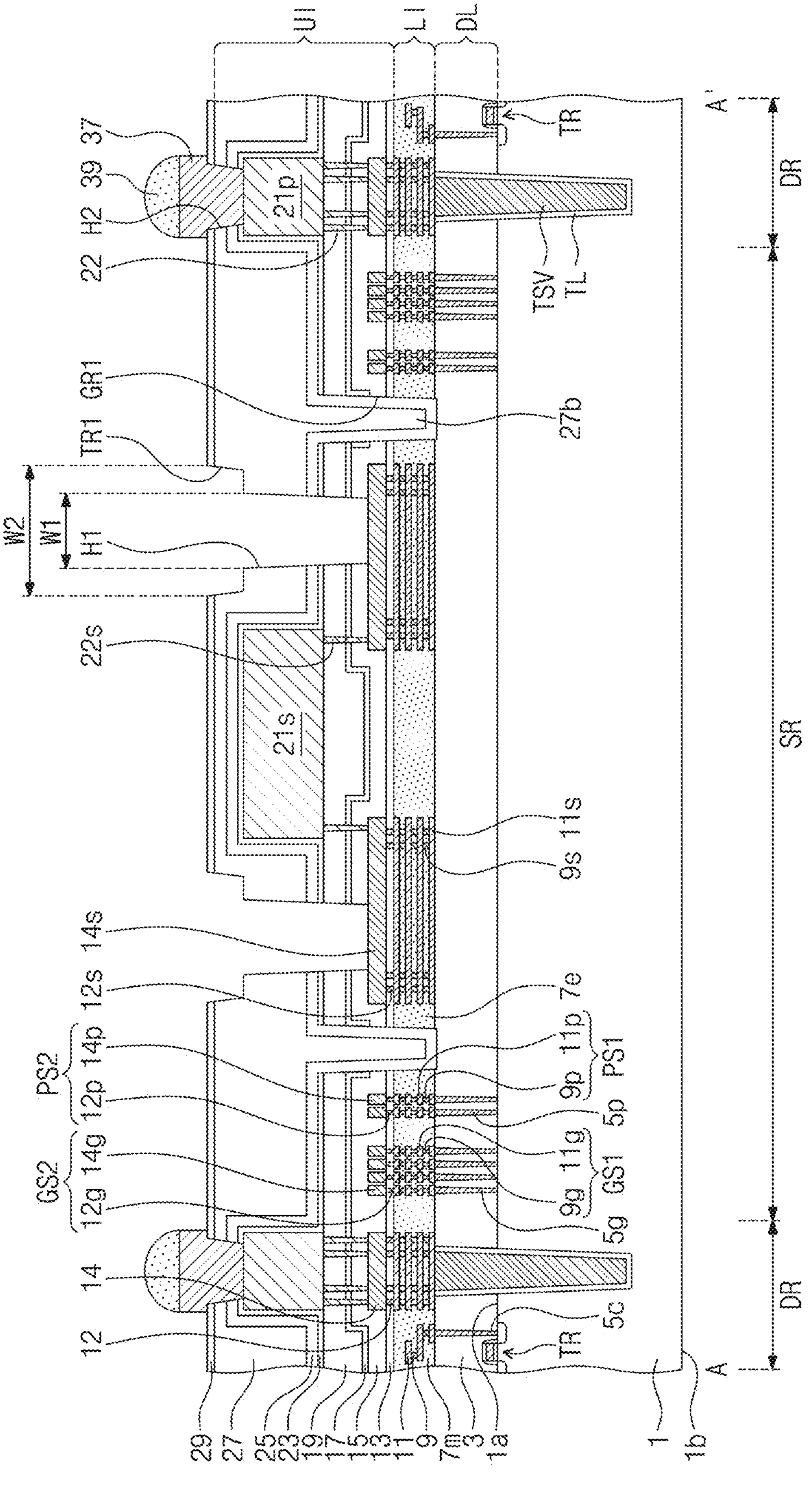

The first hole H1 may have a first width W1 of FIG. 5I. The first trench TR1 may have a second width W2 of FIG. 5I greater than the first width W1. The first trench TR1 and the first hole H1 may form a double-stepped structure. In the etching process, the upper passivation layer 29 and the fifth, sixth, and seventh upper intermetallic dielectric layers 23, 25, and 27 on the bonding pads 21*p* may be etched to form one or more second holes H2 that expose the bonding pads 21*p*.

In some example embodiments of the present inventive concepts, because the preliminary hole PH1 is previously formed in the step of FIG. 5G, in the step of FIG. 5H, an etch-target thickness of the upper dielectric pattern UI below the preliminary hole PH1 may be the same as or similar to that of the upper dielectric pattern UI on the bonding pads 21*p*. Therefore, it may be possible to block or prevent excessive etching of an upper portion of the second test pattern 14*s* and/or the bonding pad 21*p* that are first exposed when forming the first hole H1 and/or the second hole H2.

When the upper passivation layer 29 and the upper dielectric stack UI are etched to form the first hole H1 and the second hole H2 without forming the preliminary hole PH1, the bonding pads 21*p* may be first exposed because the second hole H2 is relatively deeper than the first hole H1. In this case, the bonding pads 21*p* may continuously suffer from etching damage during the formation of the first hole H1, and thus etching byproducts, Al—F compounds, may be formed by reaction between aluminum included in the bonding pad 21*p* and fluorine contained in an etchant used in an etching process. The etching byproducts may be difficult to remove in a cleaning process and may induce contamination of an etching chamber to increase manufacturing costs. In contrast, according to some example embodiments of the present inventive concepts, such problems may be mitigated or solved by forming the preliminary hole PH1 on a location at which a relatively large amount of etching is desired.

Referring to FIGS. 5H and SI, the third mask pattern MK3 may be removed to expose the top surface of the upper passivation layer 29. A test process or testing may be performed through the first holes H1. For example, probe needles of a probe card may contact surfaces of the second test patterns 14*s* exposed to the first holes H1 and apply test signals to test whether there are electrical connections between the second test patterns 14*s*. Although neighboring second test patterns 14*s* are illustrated connected to each other through the third test via patterns 22*s* and the third test pattern 21*s*, example embodiments of the present inventive concepts are not limited thereto and there may be a large variation in connection between the second test patterns 14*s*. For example, neither the third test via patterns 22*s* nor the third test pattern 21*s* may be formed. In this case, some of the first test patterns 11*s* and some of the first test via patterns 9*s* may be connected to each other to electrically connect neighboring second test patterns 14*s* to each other.

After the test process is terminated, ordinary processes may be performed to form a conductive bump 37 in the second hole H2 and to form a solder layer 39 on the conductive bump 37.

Figure 5J:
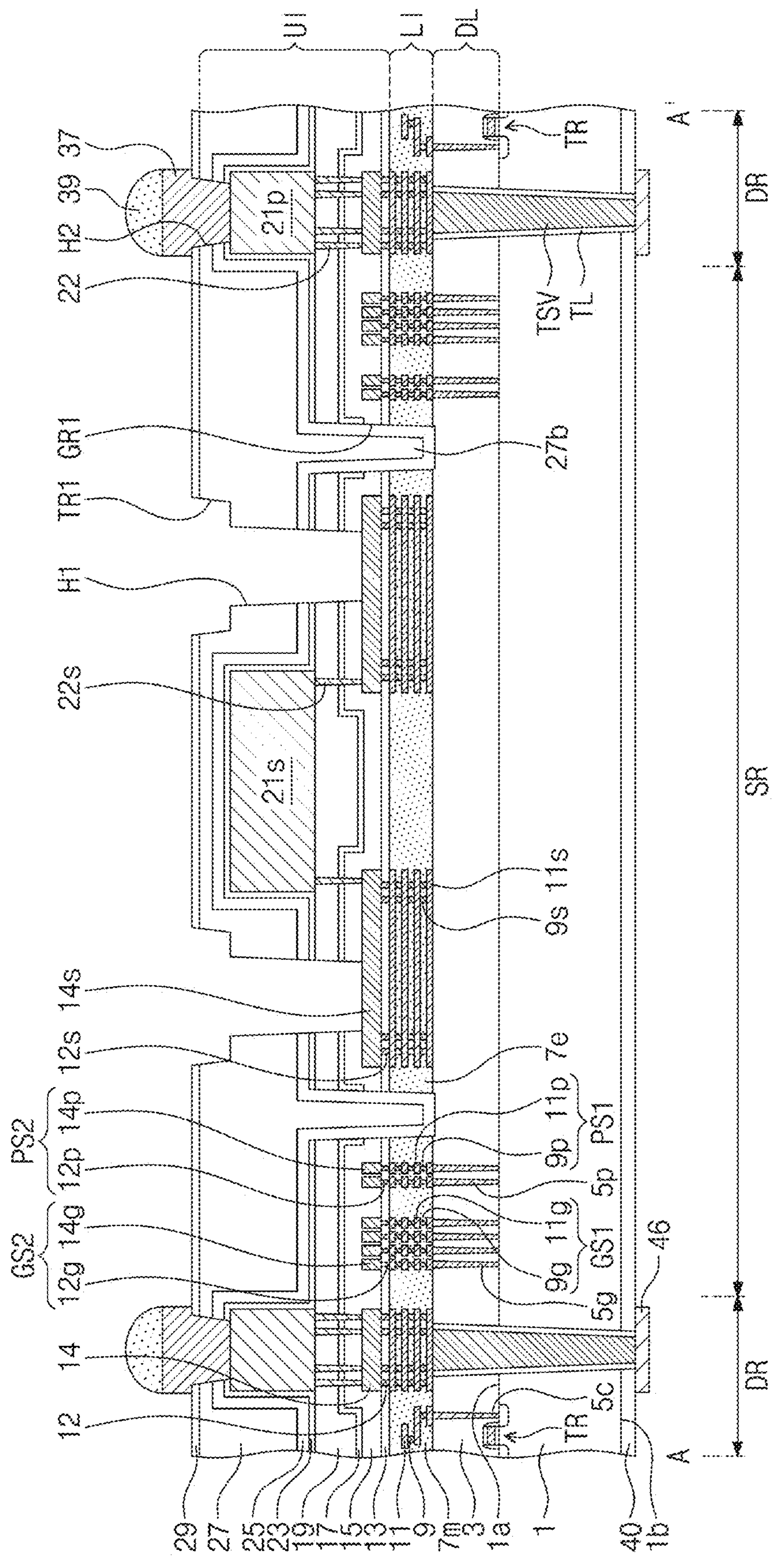

Referring to FIG. 5J, the second surface 1*b* of the substrate 1 may undergo a back grinding process to expose a bottom surface of the through dielectric layer TL. The second surface 1*b* of the substrate 1 may further be partially removed to expose a lateral surface of the through dielectric layer TL. A lower passivation layer 40 may be stacked on the second surface 1*b* of the substrate 1, and then a chemical mechanical polishing (CMP) may be performed to expose a bottom surface of the through electrode TSV. A lower bonding pad 46 may be formed to be coupled to the through electrode TSV.

Figure 5K:
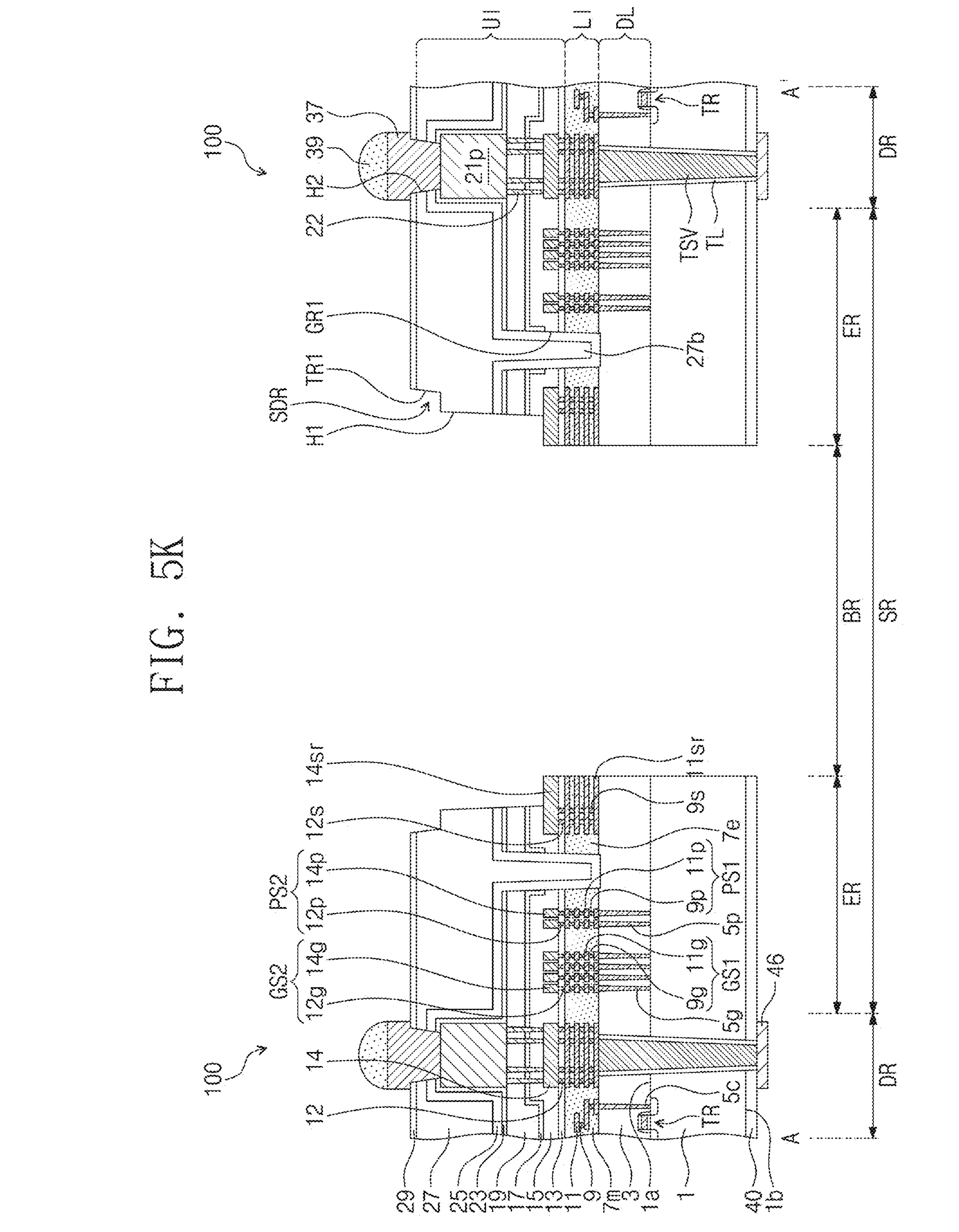

Referring to FIGS. 5J and 5K, a blade may be used such that a sawing process may be performed to remove components on a breaking region BR and to separate individual semiconductor chips 100 from each other. The sawing process may remove the substrate 1, the device interlayer dielectric layer 3, the edge lower dielectric stack 7*e*, the first, second, and third test patterns 11*s*, 14*s*, and 21*s*, the first, second, and third test via patterns 9*s*, 12*s*, and 22*s*, the upper dielectric stack UI, and the upper passivation layer 29, all of which are formed on the breaking region BR. In this step, the first and second test patterns 11*s* and 14*s* may be partially cut to form first and second residual test patterns 11*sr* and 14*sr*. In addition, the first hole H1 and the first trench TR1 may also be cut to form a stepped region SDR. Therefore, there may be formed the semiconductor chip 100 discussed with reference to FIGS. 1 and 2A. After the sawing process, the scribe lane region SR may have a portion other than the breaking region BR, and the portion of the scribe lane region SR may be an edge region ER of the semiconductor chip 100.

In the fabrication method of some example embodiments of the present inventive concepts, the third test pattern 21*s* may not be present on the second test pattern 14*s*. Moreover, as discussed above, the third test pattern 21*s* may also be omitted. Because the breaking region BR is provided thereon with no or a small number of third test patterns 21*s* that are relatively thick, it may be possible to minimize or prevent blade teeth from being stuck with aluminum included in the third test pattern 21*s* in the sawing process. When aluminum is largely stuck in the blade teeth, there may occur sawing defects such as un-cutting or damage to the blade or semiconductor chips. In contrast, some example embodiments of the present inventive concepts may solve such sawing defects.

The sawing process may cause a difference in surface roughness discussed with reference to FIGS. 3A and 3B.

Figure 6:
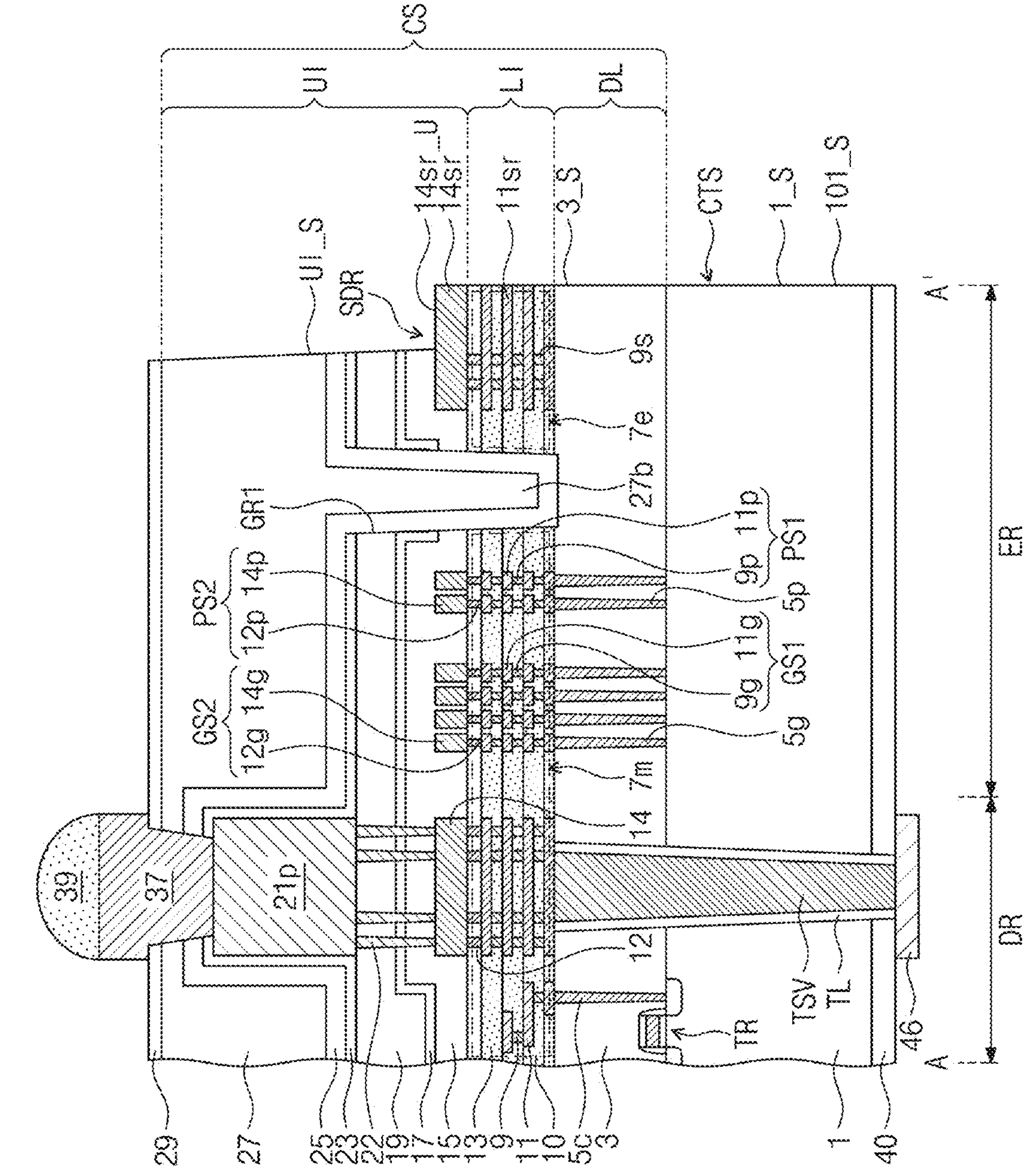
FIG. 6 is a cross-sectional view taken along line A-A' of FIG. 1.

FIG. 6 is a cross-sectional view taken along line A-A' of FIG. 1.

Referring to FIG. 6, a semiconductor chip 101 according to some example embodiments of the present embodiment may have a stepped region SDR at a chip sidewall 101_S thereof. For example, the top surface 14*sr*_U of the second residual test pattern 14*sr* may be stepped relative to the top surface of the upper passivation layer 29, and the sidewall UI_S of the upper dielectric stack UI may be offset from the sidewall 3_S of the device interlayer dielectric layer 3. The second, third, fourth, fifth, sixth, and seventh upper intermetallic dielectric layers 15, 17, 19, 23, 25, and 27 may have their sidewalls that are aligned with each other. Other structural features may be identical or similar to those discussed above.

Figure 7:
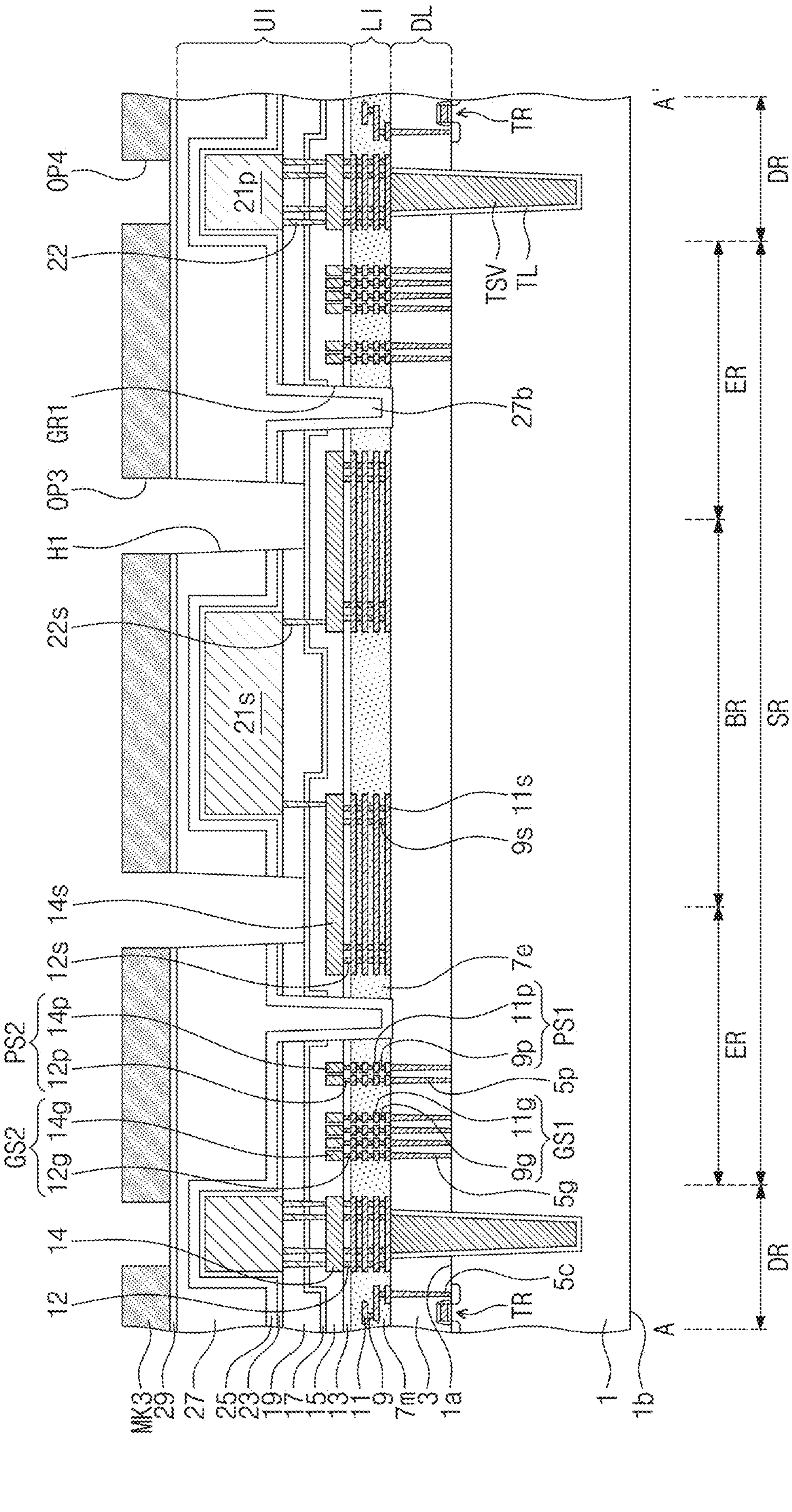
FIG. 7 is a cross-sectional view illustrating methods of fabricating the semiconductor chip of FIG. 6 according to some example embodiments of the present inventive concepts.

FIG. 7 is a cross-sectional view illustrating methods of fabricating the semiconductor chip of FIG. 6, according to some example embodiments of the present inventive concepts.

Referring to FIG. 7, after the preliminary hole PH1 is formed as shown in FIG. 5F, when the second mask pattern MK2 is removed and then the third mask pattern MK3 is formed as shown in FIG. 5G, a third opening OP3 may be formed to exactly overlap the preliminary hole PH1. For example, the third opening OP3 may be formed to have a width the same as that of the preliminary hole PH1 and to have a position in good or perfect agreement with that of the preliminary hole PH1. When the same processes discussed above are performed subsequently, the first trench TR1 of FIG. 5H may not be formed, and the semiconductor chip 101 having the configuration of FIG. 6 may be formed.

Figure 8:
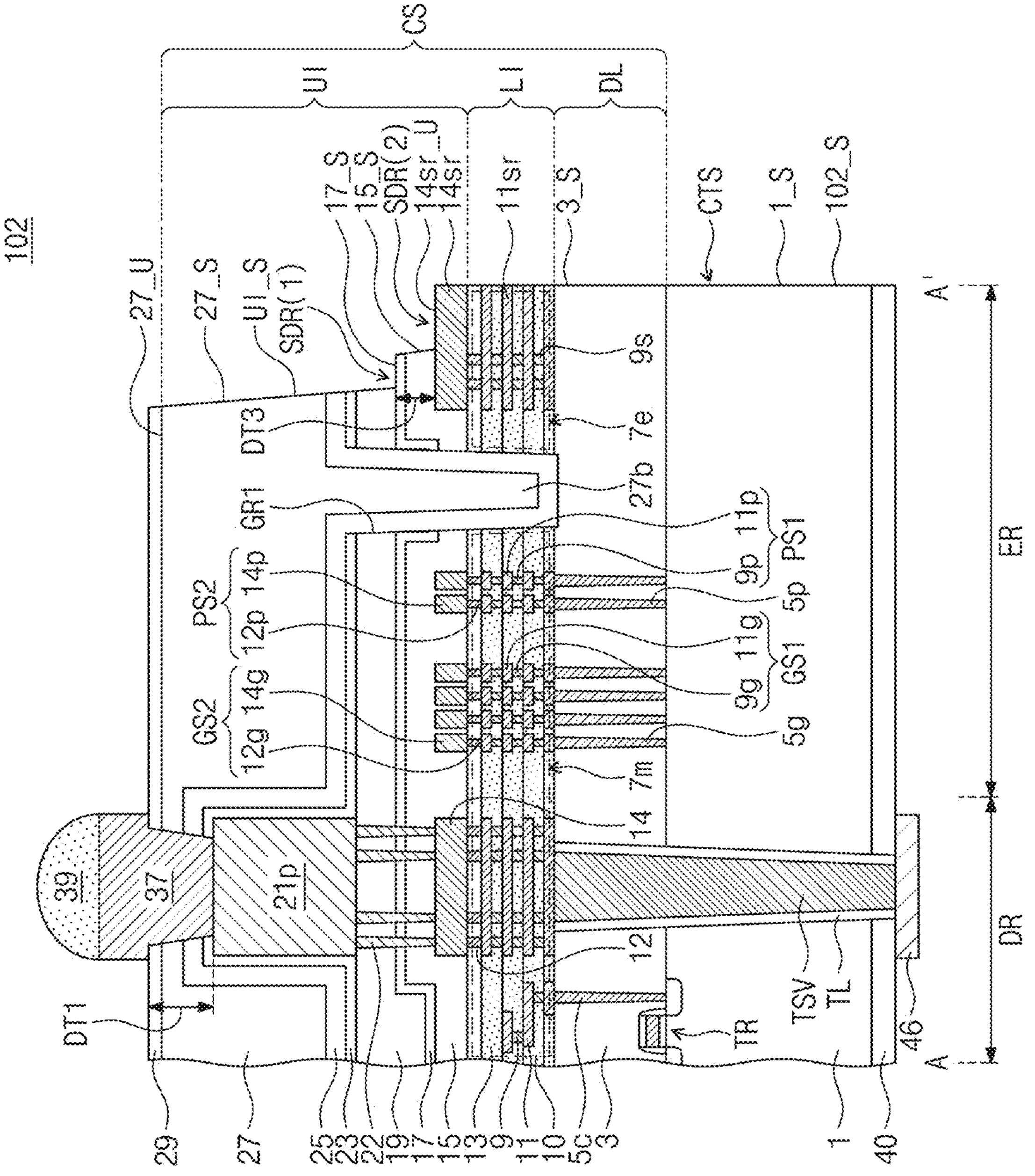
FIG. 8 is a cross-sectional view taken along line A-A' of FIG. 1.

FIG. 8 is a cross-sectional view taken along line A-A' of FIG. 1.

Referring to FIG. 8, a semiconductor chip 102 according to some example embodiments of the present embodiment may have a stepped region SDR at a chip sidewall 102_S thereof. The stepped region SDR may include a first stepped region SDR(1) and a second stepped region SDR(2). The stepped region SDR may be a double-stepped area.

The second and third upper intermetallic dielectric layers 15 and 17 may have their sidewalls that are aligned with each other. The fourth, fifth, sixth, and seventh upper intermetallic dielectric layers 19, 23, 25, and 27 may have their sidewalls that are aligned with each other. The second upper intermetallic dielectric layer 15 may have a sidewall 15_S that is offset from the sidewall 27_S of the seventh upper intermetallic dielectric layer 27. Therefore, the third upper intermetallic dielectric layer 17 may have a top surface 17_S that is partially exposed. The exposed top surface 17_S of the third upper intermetallic dielectric layer 17 and the top surface of the upper passivation layer 29 may constitute a step difference to form the first stepped region SDR(1). The exposed top surface 17_S of the third upper intermetallic dielectric layer 17 may be stepped relative to the top surface 14*sr*_U of the second residual test pattern 14*sr* (or relative to the top surface of the first upper intermetallic dielectric layer 13), and the second stepped region SDR(2) may be formed by the top surface 17_S and the top surface 14*sr*_U that are stepped relative to each other. The top surface 14*sr*_U of the second residual test pattern 14*sr* may be positioned at a third depth DT3 from the top surface 17_S of the third upper intermetallic dielectric layer 17. The third depth DT3 may be, for example, about 0.9 times to about 2.0 times the first depth DT1 which will be discussed below. Other structural features may be identical or similar to those discussed above.

Figure 9A:
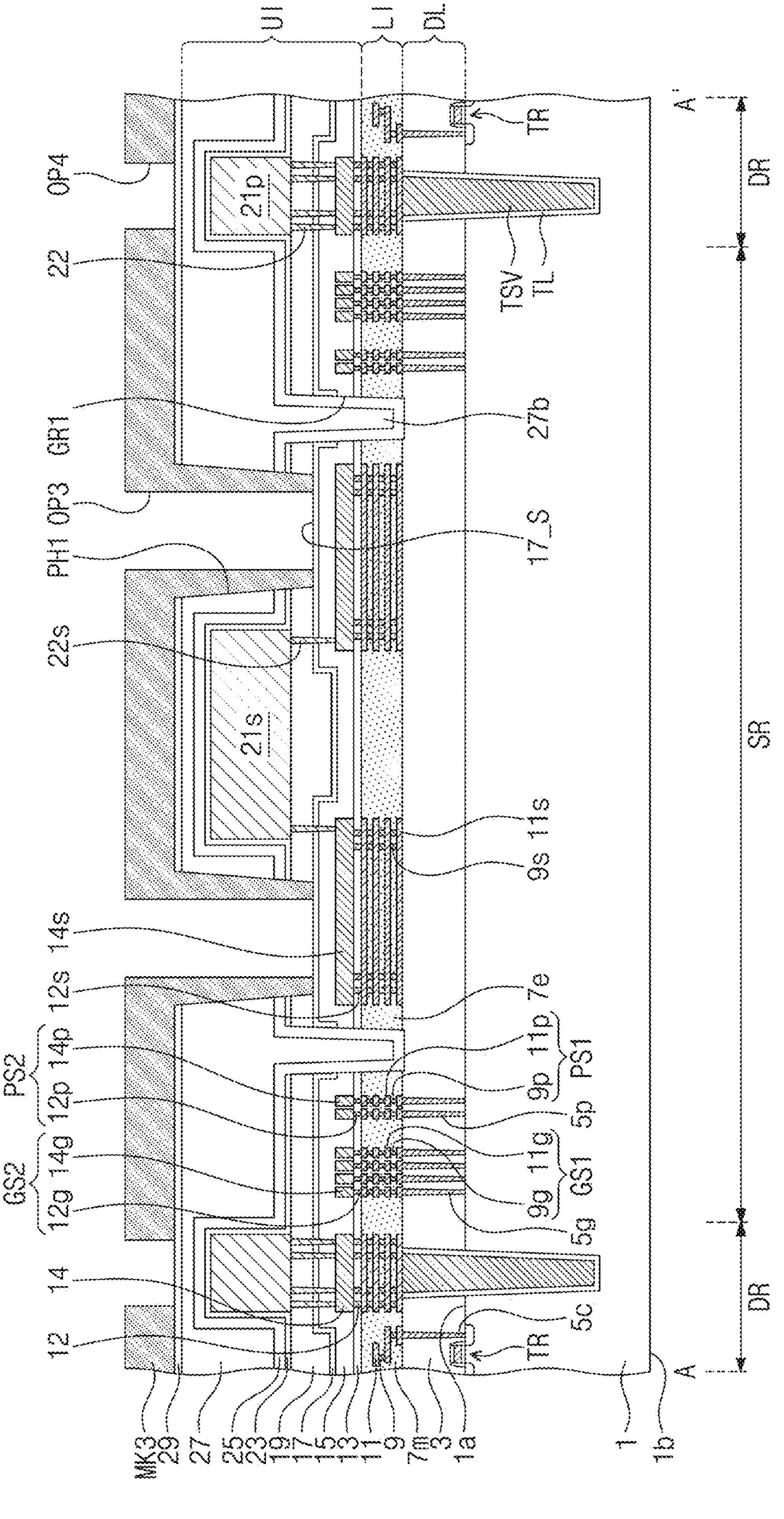
FIGS. 9A to 9C are cross-sectional views illustrating methods of fabricating the semiconductor chip of FIG. 8.
Figure 9B:
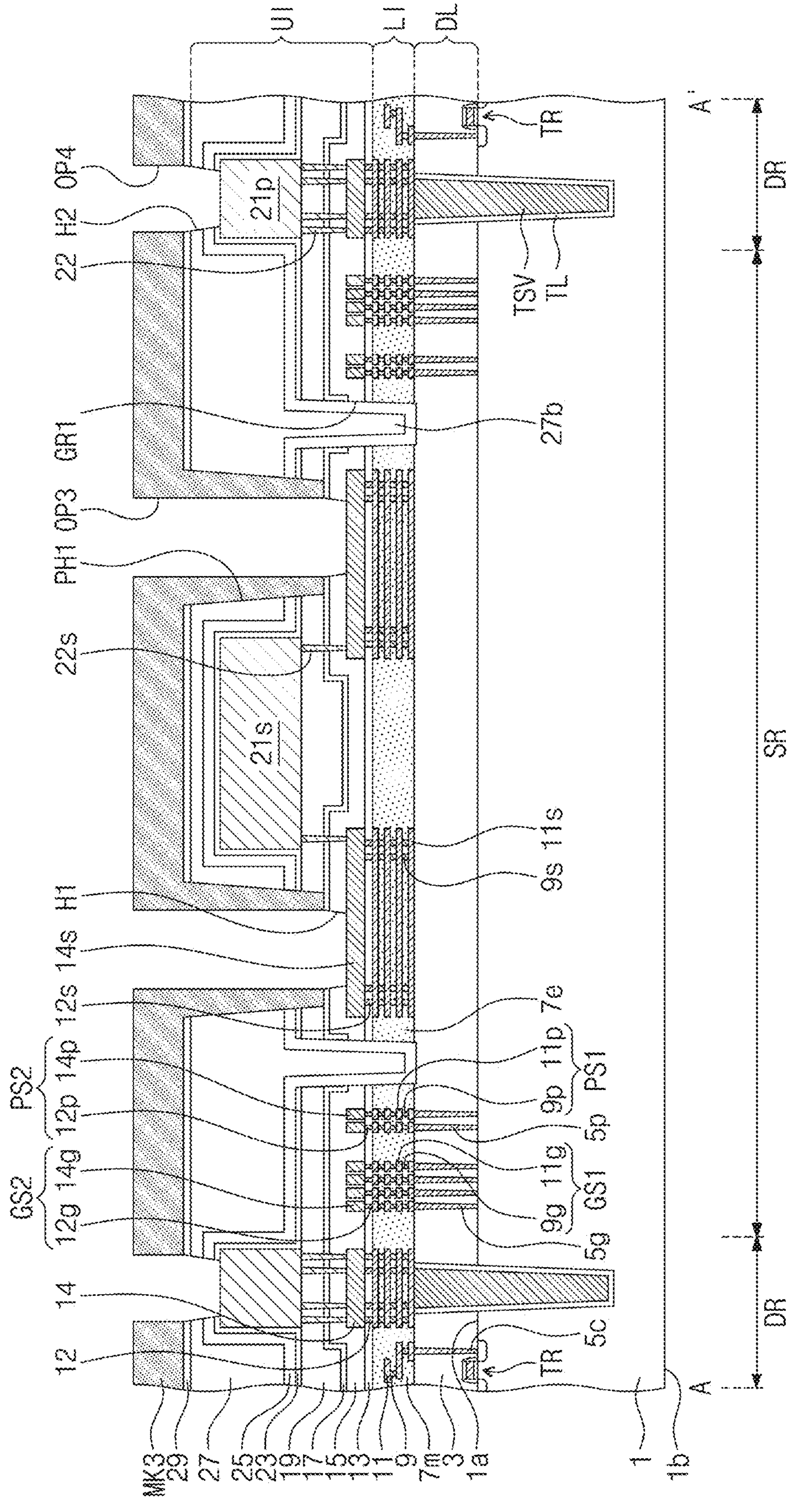
Figure 9C:
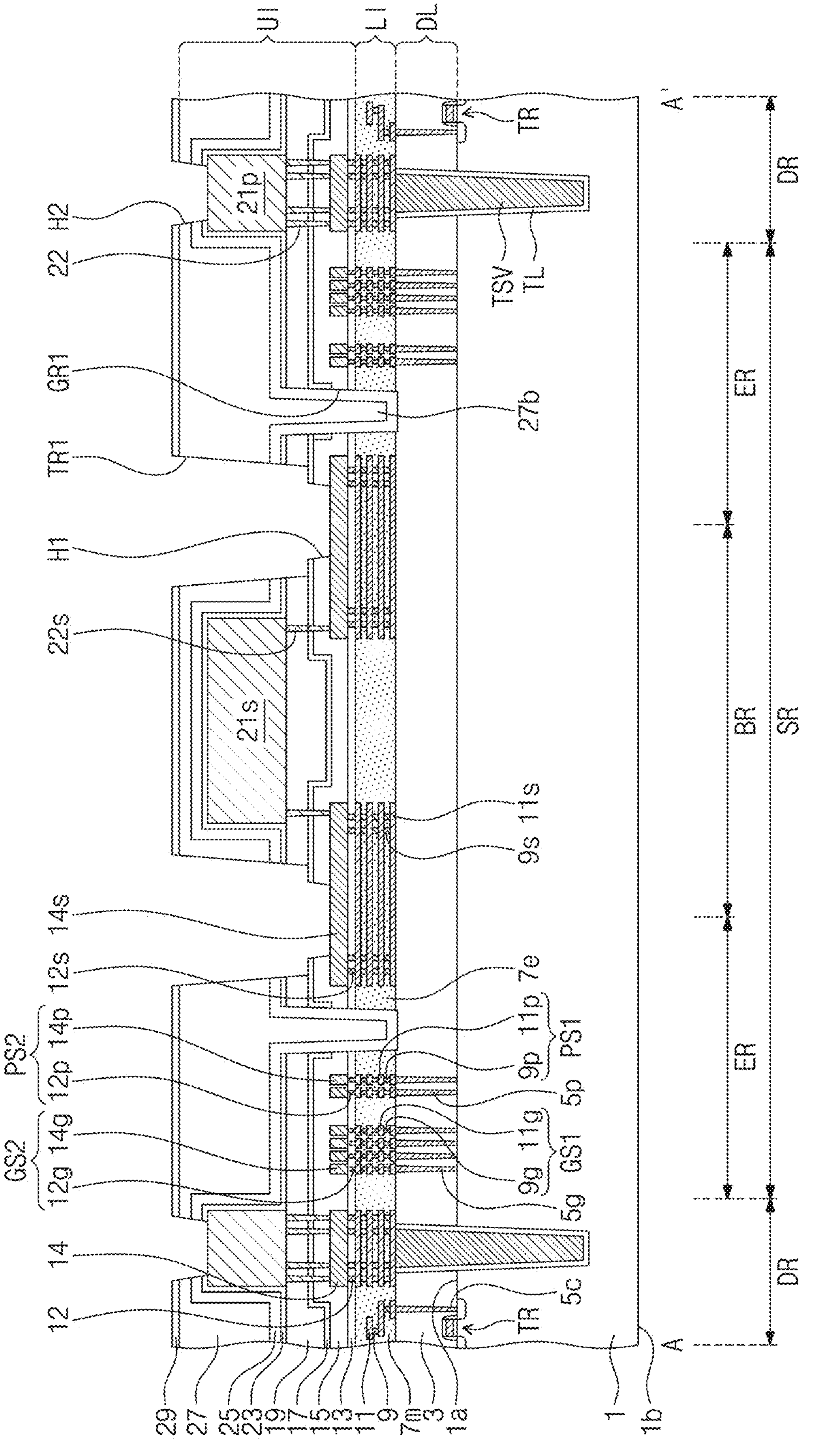

FIGS. 9A to 9C are cross-sectional views illustrating methods of fabricating the semiconductor chip of FIG. 8.

Referring to FIG. 9A, the second mask pattern MK2 may be removed in the state of FIG. 5F, and a third mask pattern MK3 may be formed. The third mask pattern MK3 may have a third opening OP3 and a fourth opening OP4. The third opening OP3 may have a width less than that of the preliminary hole PH1. A portion of the third mask pattern MK3 may be inserted into the preliminary hole PH1 to cover an entire inner sidewall of the preliminary hole PH1 and also to cover a portion of a bottom surface of the preliminary hole PH1. The third opening OP3 may expose only a portion of the bottom surface of the preliminary hole PH1. For example, an area of the top surface 17_S of the third upper intermetallic dielectric layer 17 exposed to the preliminary hole PH1 may be larger than an area of the top surface 17_S of the third upper intermetallic dielectric layer 17 exposed to the third opening OP3.

Referring to FIG. 9B, the third mask pattern MK3 may be used as an etching mask such that an etching process may be performed to etch the upper dielectric pattern UI exposed to the third opening OP3 and the fourth opening OP4 and to etch the second and third upper intermetallic dielectric layers 15 and 17, which may result in the formation of a first hole H1 that exposes the second test pattern 14*s*. In the etching process, the upper passivation layer 29 and the fifth, sixth, and seventh upper intermetallic dielectric layers 23, 25, and 27 on the bonding pads 21*p* may be etched to form one or more second holes H2 that expose the bonding pads 21*p*.

Referring to FIGS. 9B and 9C, the third mask pattern MK3 may be removed to expose the inner sidewall of the preliminary hole PH1. In some example embodiments of the present embodiment, the preliminary hole PH1 may be called a first trench TR1. The inner sidewall of the first trench TR1 and an inner sidewall of the first hole H1 may form a double-stepped structure. Other process steps may be identical or similar to those discussed above.

Figure 10:
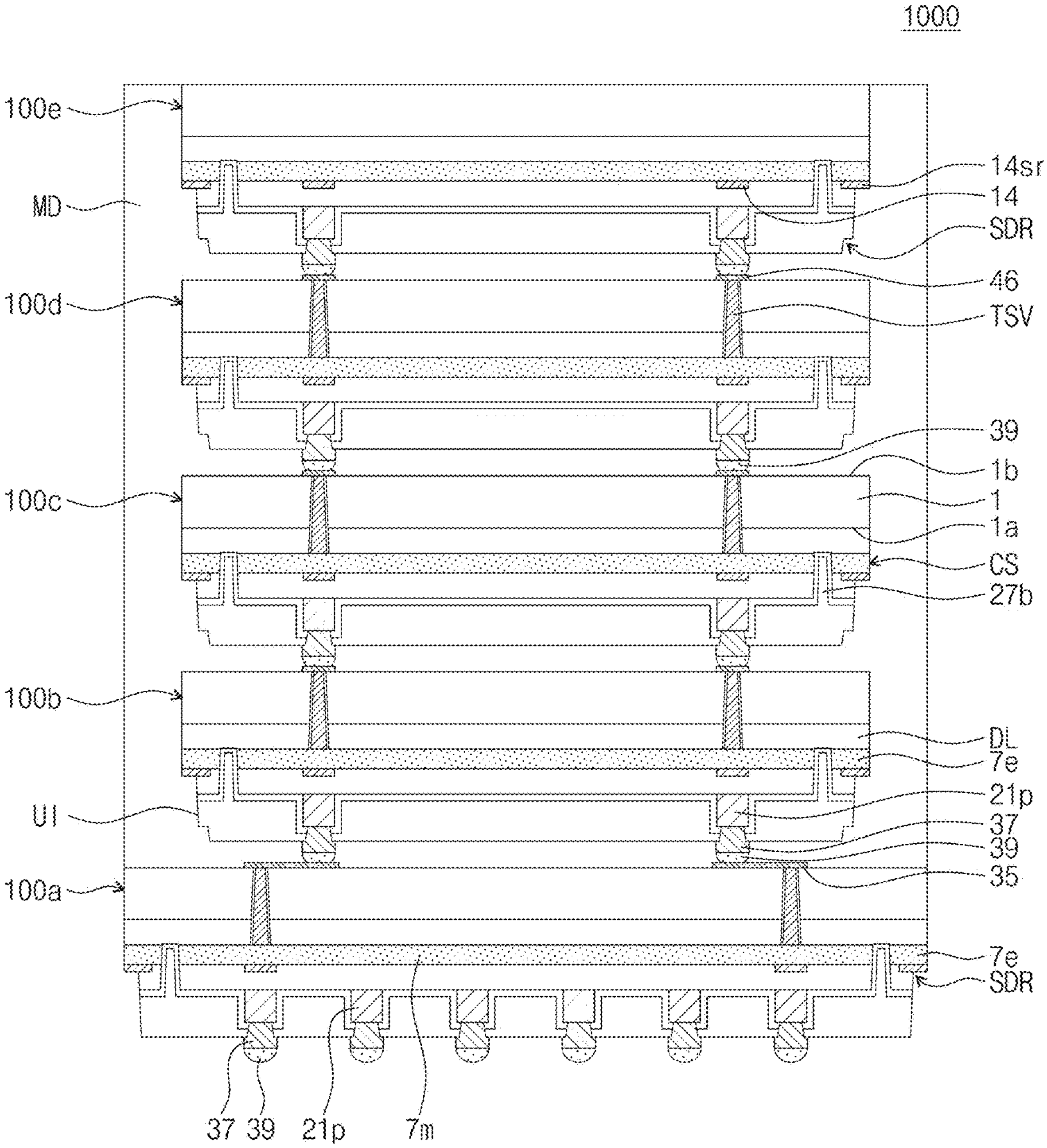
FIG. 10 is a cross-sectional view illustrating semiconductor packages according to some example embodiments of the present inventive concepts.

FIG. 10 is a cross-sectional view illustrating semiconductor packages according to some example embodiments of the present inventive concepts.

Referring to FIG. 10, a semiconductor package 1000 according to some example embodiments of the present inventive concepts may include first, second, third, fourth, and fifth semiconductor chips 100*a*, 100*b*, 100*c*, 100*d*, and 100*e* that are sequentially stacked. The first semiconductor chip 100*a* may be of a different type from the second to fifth semiconductor chips 100*b* to 100*e*. The first semiconductor chip 100*a* may be, for example, a logic circuit chip. The second to fifth semiconductor chips 100*b* to 100*e* may the same memory chip. For example, the memory chip may be DRAM, NAND Flash, SRAM, MRAM, or PRAM. The present example embodiment discloses a structure where one logic circuit chip and four memory chips are stacked, but the number of the logic circuit chip and the number of the memory chips may be variously changed without being limited thereto. The first semiconductor chip 100*a* may have a width greater than those of the second to fifth semiconductor chips 100*b* to 100*e*. The semiconductor package 1000 may be a high bandwidth memory (HBM) chip.

The first semiconductor chip 100*a* may be called as or replaced with a package substrate or a redistribution substrate.

A mold layer MD may cover a top surface of the first semiconductor chip 100*a* and lateral surfaces of the second to fifth semiconductor chips 100*b* to 100*e*. The mold layer MD may include a dielectric resin, for example, an epoxy molding compound (EMC). The mold layer MD may further include fillers, and the fillers may be dispersed in the dielectric resin. The fillers may include, for example, silicon oxide ($SiO_2$). The mold layer MD may have a top surface coplanar with the second surface 1*b* of the substrate 1 included in the fifth semiconductor chip 100*e*.

Each of the first to fifth semiconductor chips 100*a* to 100*e* may have characteristics the same as or similar to those of one or more of the semiconductor chips 100, 101, and 102 discussed with reference to FIGS. 1 to 3B, 6, and 8. For example, the semiconductor package 1000 may have a structure in which are stacked a plurality of inverted semiconductor chips 100, 101, and/or 102 discussed with reference to FIGS. 1 to 3B, 6, and 8. Identical or similar to the semiconductor chips 100, 101, and 102 discussed with reference to FIGS. 1 to 3B, 6, and 8, each of the first to fifth semiconductor chips 100*a* to 100*e* may include the circuit structure CS disposed on the first surface 1*a* of the substrate 1. Omission will be made to avoid a repetitive description of the circuit structure CS explained above with reference to FIGS. 1 to 3B, 6, and 8. Because the semiconductor chips 100, 101, and 102 discussed with reference to FIGS. 1 to 3*b*, 6, and 8 are turned upside down, and thus terms "top/upper" and "bottom/lower" are interchangeable based on the point of view.

Among the first to fifth semiconductor chips 100*a* to 100*e*, an underlying semiconductor chip may include the lower bonding pad 46 coupled to the solder layer 39 disposed on an overlying semiconductor chip.

Each of the first to fifth semiconductor chips 100*a* to 100*e* may have the stepped region SDR at its edge region. The stepped regions SDR of the second to fifth semiconductor chips 100*b* to 100*e* may be filled with the mold layer MD. The mold layer MD may cover a bottom surface of the second residual test pattern 14*sr* and a sidewall of the upper dielectric stack UI.

The fifth semiconductor chip 100*e* at top position may not include any of the through electrode TSV and the lower bonding pad 46. Other structural features may be identical or similar to those discussed above. A redistribution pattern 35 may be disposed on a top surface of the first semiconductor chip 100*a* (or the second surface 1*b* of the substrate 1), and may be coupled to the solder layer 39 of the second semiconductor chip 100*b*.

As the semiconductor package 1000 according to some example embodiments of the present embodiment includes the semiconductor chips 100*a* to 100*e* whose reliability is increased, it may be possible to block or prevent electrical shorts caused by metal burs and to increase reliability of the semiconductor package 1000.

According to some example embodiments of the present inventive concepts, a semiconductor chip and a semiconductor package including the same may be configured such that a thick metal pattern located at the same level as that of a bonding pad is not exposed on a sidewall of an upper dielectric stack. Therefore, when the semiconductor chip is mounted, there may be no occurrence of electrical short due to metal burs. As a result, the semiconductor chip and the semiconductor package may increase in reliability.

In a semiconductor chip fabrication method according to some example embodiments of the present inventive concepts, because a breaking region is provided thereon with no or a small number of thick metal patterns located at the same level as that of the bonding pad, it may be possible to block or prevent damage to blades or semiconductor chips and to minimize or prevent sawing defects. Further, according to the semiconductor chip fabrication method in accordance with some example embodiments of the present inventive concepts, because a preliminary hole is formed on a location of a layer having different etch-target thicknesses and needing a relatively large amount of etching on a region where, the bonding pad may be blocked or prevented from etching damage and etching equipment may be prohibited from contamination. As a result, a yield may increase.

Although the present inventive concepts have been described in connection with some example embodiments of the present inventive concepts illustrated in the accompanying drawings, it will be understood to those skilled in the art that various changes and modifications may be made without departing from the technical spirit and essential feature of the present inventive concepts. It will be apparent to those skilled in the art that various substitution, modifications, and changes may be thereto without departing from the scope and spirit of the present inventive concepts.

What is claimed is:

1. A semiconductor chip, comprising:
a substrate including a device region and an edge region;
a device layer and a wiring layer sequentially stacked on the substrate;
a residual test pattern and a sub-pad on the wiring layer, the sub-pad being on the device region, the residual test pattern being on the edge region, and a sidewall of the residual test pattern being aligned with a sidewall of the substrate;
an upper dielectric stack covering the sub-pad and the residual test pattern;
a bonding pad in the upper dielectric stack and connected to the sub-pad; and
a passivation layer covering the upper dielectric stack,
wherein the upper dielectric stack exposes a portion of a top surface of the residual test pattern,
wherein a sidewall of the upper dielectric stack has a stepped region,
wherein a top surface of the bonding pad is at a first depth from a top surface of the passivation layer,
wherein a bottom surface of the stepped region is at a second depth from the top surface of the passivation layer, and
wherein the second depth is about 0.9 times to about 2.0 times the first depth.

2. The semiconductor chip of claim 1, wherein
the upper dielectric stack includes a plurality of upper dielectric layers that are sequentially stacked, and
a sidewall of an uppermost one of the upper dielectric layers has the stepped region.

3. The semiconductor chip of claim 1, wherein
the upper dielectric stack includes a plurality of upper dielectric layers that are sequentially stacked, and
a sidewall of a lowermost one of the upper dielectric layers is offset from a sidewall of an uppermost one of the upper dielectric layers.

4. The semiconductor chip of claim 1, wherein
the device layer includes a device interlayer dielectric layer,
the upper dielectric stack includes a plurality of upper dielectric layers that are sequentially stacked, and
a surface roughness at a sidewall of an uppermost one of the upper dielectric layers is less than a surface roughness at a sidewall of the device interlayer dielectric layer.

5. The semiconductor chip of claim 1, wherein
the wiring layer includes a lower dielectric stack, the lower dielectric stack including a plurality of lower dielectric layers,
the upper dielectric stack includes a plurality of upper dielectric layers,
each of the lower dielectric layers includes a first dielectric material which has a dielectric constant less than a dielectric constant of silicon oxide, and
each of the upper dielectric layers includes a second dielectric material which has a dielectric constant greater than the dielectric constant of the first dielectric material included in each of the lower dielectric layers.

6. The semiconductor chip of claim 5, wherein
a portion of the upper dielectric layers penetrates the lower dielectric stack on the edge region to divide the lower dielectric stack into a primary lower dielectric stack and an edge lower dielectric stack,
the primary lower dielectric stack covers the device region and a portion of the edge region, and
the edge lower dielectric stack covers a remaining portion of the edge region.

7. The semiconductor chip of claim 6, further comprising:
a guard ring structure in the primary lower dielectric stack, the guard ring structure surrounding the device region, when viewed in a plan view; and
a chipping dam structure in the primary lower dielectric stack, the chipping dam structure surrounding the guard ring structure, when viewed in a plan view.

8. The semiconductor chip of claim 1, wherein the sub-pad and the residual test pattern are at a same level and are identical in terms of material and thickness.

9. The semiconductor chip of claim 1, further comprising:
a conductive bump penetrating the passivation layer and coupled to the bonding pad; and
a solder layer coupled to the conductive bump.

10. The semiconductor chip of claim 1, wherein
the upper dielectric stack includes a plurality of upper dielectric layers that are sequentially stacked, and
a sidewall of an uppermost one of the upper dielectric layers has a square wave shape when viewed in a plan view.

11. A semiconductor chip, comprising:
a substrate including a device region and an edge region;
a device layer and a wiring layer sequentially stacked on the substrate;
a residual test pattern and a sub-pad on the wiring layer, the sub-pad being on the device region, the residual test pattern being on the edge region, and a sidewall of the residual test pattern being aligned with a sidewall of the substrate;
an upper dielectric stack covering the sub-pad and the residual test pattern;
a passivation layer on the upper dielectric stack;

a separation dielectric pattern penetrating the wiring layer on the edge region;

a bonding pad in the upper dielectric stack and connected to the sub-pad;

a conductive bump penetrating the passivation layer and coupled to the bonding pad; and a solder layer coupled to the conductive bump, wherein the upper dielectric stack exposes a portion of a top surface of the residual test pattern, wherein a sidewall of the upper dielectric stack has a stepped region, wherein a top surface of the bonding pad is at a first depth from a top surface of the passivation layer, wherein a bottom surface of the stepped region is at a second depth from the top surface of the passivation layer, and wherein the second depth is about 0.9 times to about 2.0 times the first depth.

12. The semiconductor chip of claim 11, wherein the upper dielectric stack includes a plurality of upper dielectric layers that are sequentially stacked, and a sidewall of an uppermost one of the upper dielectric layers has the stepped region.

13. The semiconductor chip of claim 11, wherein the upper dielectric stack includes a plurality of upper dielectric layers that are sequentially stacked, and a sidewall of a lowermost one of the upper dielectric layers is offset from a sidewall of an uppermost one of the upper dielectric layers.

14. The semiconductor chip of claim 11, wherein the device layer includes a device interlayer dielectric layer, the upper dielectric stack includes a plurality of upper dielectric layers that are sequentially stacked, and a surface roughness at a sidewall of an uppermost one of the upper dielectric layers is less than a surface roughness at a sidewall of the device interlayer dielectric layer.

15. A semiconductor chip, comprising:

a substrate including a device region and an edge region;

a device layer and a wiring layer sequentially stacked on the substrate;

a residual test pattern and a sub-pad on the wiring layer, the sub-pad being on the device region, the residual test pattern being on the edge region, and a sidewall of the residual test pattern being aligned with a sidewall of the substrate; and an upper dielectric stack that covers the sub-pad and the residual test pattern, wherein the upper dielectric stack exposes a portion of a top surface of the residual test pattern, wherein the device layer includes a device interlayer dielectric layer, wherein the upper dielectric stack includes a plurality of upper dielectric layers that are sequentially stacked, and wherein a surface roughness at a sidewall of an uppermost one of the upper dielectric layers is less than a surface roughness at a sidewall of the device interlayer dielectric layer.

16. The semiconductor chip of claim 15, wherein the sidewall of the residual test pattern is offset from a sidewall of the upper dielectric stack.

17. The semiconductor chip of claim 15, wherein a sidewall of the upper dielectric stack has a stepped region.

18. The semiconductor chip of claim 15, wherein the upper dielectric stack includes a plurality of upper dielectric layers that are sequentially stacked, and a sidewall of an uppermost one of the upper dielectric layers has a stepped region.

19. The semiconductor chip of claim 15, wherein the upper dielectric stack includes a plurality of upper dielectric layers that are sequentially stacked, and a sidewall of a lowermost one of the upper dielectric layers is offset from a sidewall of an uppermost one of the upper dielectric layers.

20. The semiconductor chip of claim 15, wherein the upper dielectric stack includes a plurality of upper dielectric layers that are sequentially stacked, and a sidewall of an uppermost one of the upper dielectric layers has a square wave shape when viewed in a plan view.

* * * * *